US007926163B2

(12) United States Patent
Kato et al.

(10) Patent No.: US 7,926,163 B2
(45) Date of Patent: Apr. 19, 2011

(54) METHOD OF PRODUCING AN OSCILLATOR DEVICE

(75) Inventors: Takahisa Kato, Tokyo (JP); Yukio Furukawa, Mountain View, CA (US); Takahiro Akiyama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 101 days.

(21) Appl. No.: 12/481,472

(22) Filed: Jun. 9, 2009

(65) Prior Publication Data

US 2009/0235502 A1 Sep. 24, 2009

Related U.S. Application Data

(62) Division of application No. 11/756,003, filed on May 31, 2007, now Pat. No. 7,557,972.

(30) Foreign Application Priority Data

Jun. 7, 2006 (JP) ................................. 2006/158004
Mar. 15, 2007 (JP) ................................. 2007/065950
May 16, 2007 (JP) ................................. 2007/130619

(51) Int. Cl.
*H04R 31/00* (2006.01)

(52) U.S. Cl. ... 29/594; 29/609.1; 156/89.11; 156/89.12; 156/250; 181/171; 181/172; 367/140; 367/141; 367/170; 367/171; 381/113; 381/116; 381/191; 381/172; 381/174

(58) Field of Classification Search ................. 29/592.1, 29/594, 609.1; 156/89.11, 89.12, 250; 181/171, 181/172; 367/140, 141, 170, 171, 181; 381/113, 381/116, 168, 173, 174, 191, 355
See application file for complete search history.

(56) References Cited

U.S. PATENT DOCUMENTS 4,918,920 A * 4/1990 Duroux ........................... 60/536
(Continued)

FOREIGN PATENT DOCUMENTS

JP          8-75475          3/1996
(Continued)

OTHER PUBLICATIONS

Chinese Office Action in Chinese Application No. 2007-101096247 dated Nov. 21, 2008.

(Continued)

*Primary Examiner* — Paul D Kim
(74) *Attorney, Agent, or Firm* — Fitzpatrick, Cella, Harper & Scinto

(57) ABSTRACT

An oscillator device having an oscillating member, a resilient support and a supporting member is produced. The oscillating member is supported by the resilient support for oscillation about an oscillation axis. The oscillating member is formed with a movable element having protrusions for adjusting its mass, the protrusions extending from the movable element parallel to the oscillation axis and being formed in pairs disposed at positions symmetrical with respect to the oscillation axis. A sectional area of each protrusion along a plane perpendicular to the oscillation axis is constant in the oscillation axis direction. A laser beam is projected to a cutting position of protrusions, so as to partly remove the protrusion. The protrusions are cut based on adjusting the cutting position. The sum of the lengths removed from the protrusions by the cutting becomes equal to a predetermined length to thereby adjust an inertia moment of the oscillating member.

11 Claims, 12 Drawing Sheets

U.S. PATENT DOCUMENTS

| | | | |
|---|---|---|---|
| 5,969,465 A | 10/1999 | Neukermans et al. | |
| 6,088,378 A | 7/2000 | Furukawa | |
| 6,282,226 B1 | 8/2001 | Furukawa | |
| 6,464,130 B1 * | 10/2002 | Itoh et al. | 228/245 |
| 6,747,784 B2 | 6/2004 | Little et al. | |
| 6,804,279 B2 | 10/2004 | Furukawa | |
| 6,925,782 B2 * | 8/2005 | Aylward | 53/475 |
| 7,068,296 B2 | 6/2006 | Hayashi et al. | |
| 7,248,390 B2 | 7/2007 | Harris | |
| 2002/0196522 A1 | 12/2002 | Little et al. | |
| 2003/0072066 A1 | 4/2003 | Hayashi et al. | |
| 2003/0122066 A1 | 7/2003 | Dunfield | |
| 2005/0162722 A1 | 7/2005 | Harris | |

FOREIGN PATENT DOCUMENTS

| | | |
|---|---|---|
| JP | 2002-40355 | 4/2002 |
| JP | 2003-84226 | 3/2003 |
| JP | 2004-219889 | 8/2004 |
| JP | 2005-326745 | 11/2005 |
| JP | 2006-039377 | 2/2006 |
| JP | 2006-230048 | 8/2006 |
| JP | 2006-239842 | 9/2006 |
| WO | 98-44571 | 10/1998 |
| WO | 2002-037163 | 5/2002 |
| WO | 2002-037164 | 5/2002 |
| WO | 2004-083781 | 9/2004 |

OTHER PUBLICATIONS

Korean Office Action in Korean Application No. 2008-054253799 dated Oct. 24, 2008.

Chinese Office Action dated Jun. 2, 2010 in corresponding Chinese Application No. 200910132946.2.

Korean Search Report in corresponding Korean Application No. 10-2009-6183 dated Jun. 28, 2010.

* cited by examiner

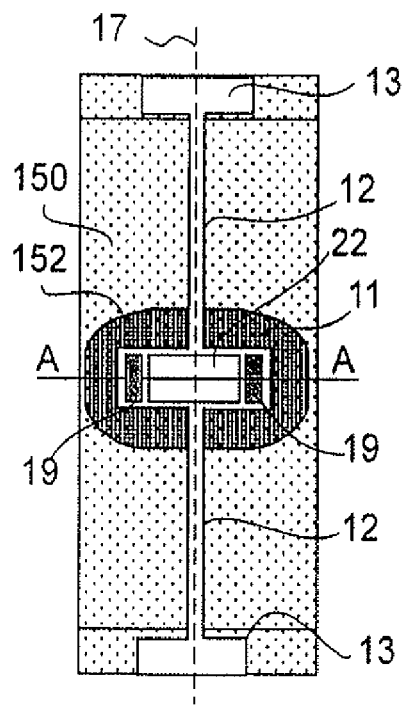 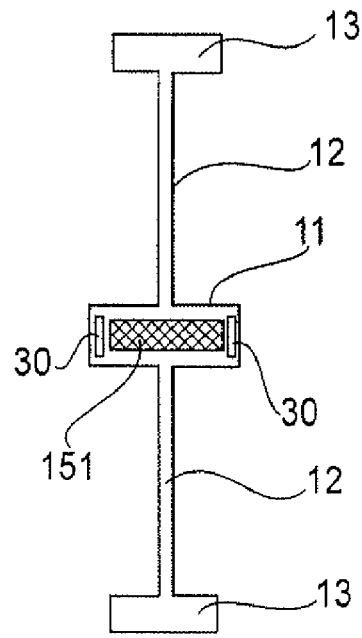
FIG.1A  FIG.1B
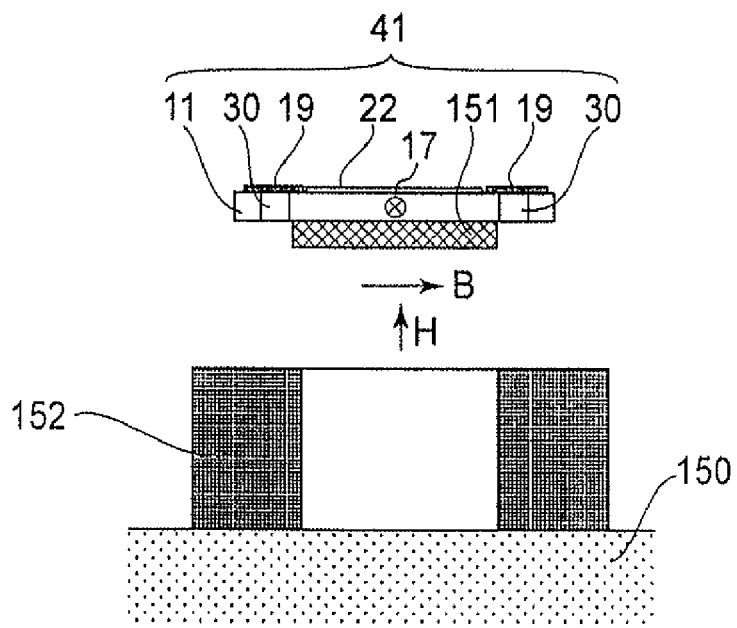
FIG.2

METHOD OF PRODUCING AN OSCILLATOR DEVICE

This application is a divisional of U.S. patent application Ser. No. 11/756,003, filed May 31, 2007, now U.S. Pat. No. 7,557,972, the contents of which are incorporated by reference herein.

FIELD OF THE INVENTION AND RELATED ART

This invention relates to an oscillator device having a movable element supported for oscillating motion, an optical deflector having such oscillator device, an optical instrument such as an image forming apparatus or a display device, for example, using such optical deflector, and a method of producing an oscillator device. The optical deflector of the present invention is suitably usable in a projection display wherein an image is projected based on deflective scan of light, or an image forming apparatus such as a laser beam printer or digital copying machine having an electrophotographic process, for example.

With regard to such optical deflectors, various types of optical scanning systems or optical scanning devices wherein a movable element having a reflection surface is sinusoidally oscillated to deflect light have been proposed. Optical scanning systems with an optical deflector sinusoidally oscillated based on a resonance phenomenon have advantageous features, as compared with scanning optical systems using a rotary polygonal mirror (polygon mirror), such as follows. That is, the optical deflector can be made quite small in size; the power consumption is low; and particularly those optical deflectors made of Si monocrystal and produced by semiconductor processes are theoretically free from metal fatigue and have good durability.

In such optical deflectors based on the resonance phenomenon, with respect to a driving frequency desired, the frequency of a natural oscillation mode to be targeted is predetermined. There are some good proposals for production method of the same.

Japanese Laid-Open Patent Application No. 2002-40355 discloses a method wherein a planar galvano mirror comprising a movable plate having a reflection surface and a coil and being resiliently supported for oscillating motion with respect to a torsional axis is used, and wherein the galvano mirror has mass load portions formed at the opposite ends of the movable plate. A laser beam is projected to the mass load portions to remove the mass thereof thereby to adjust the moment of inertia. A desired frequency is accomplished thereby.

Japanese Laid-Open Patent Application No. 2004-219889 discloses a method wherein a movable plate is coated with a mass piece such as, typically, resin, and the frequency is adjusted based on a similar principle as described above.

SUMMARY OF THE INVENTION

In the methods described above, if a large amount of adjustment should be made, it requires extensive time to do the adjustment machining process. Furthermore, with the adjustment principle used in these methods, it is very difficult to quickly and simultaneously adjust the frequency and the position of a gravity center.

In accordance with an aspect of the present invention, these inconveniences can be removed by a method of producing an oscillator device having an oscillating member, a resilient support and a supporting member, the oscillating member being resiliently supported by the resilient support for oscillation about an oscillation axis. The method is characterized by: forming the oscillating member with a movable element and a mass adjusting member for adjusting a mass of the oscillating member, while defining a cavity between the movable element and a portion of the mass adjusting member; and irradiating the mass adjusting member with a laser beam to partly remove a material of the mass adjusting member contiguous to the cavity, the material being removed thereby including a portion of the mass adjusting member not irradiated with the laser beam.

In accordance with another aspect of the present invention, there is provided a method of producing an oscillator device having an oscillating member, a resilient support and a supporting member, the oscillating member being resiliently supported by the resilient support for oscillation about an oscillation axis, said method being characterized by: forming the oscillating member with a movable element having a protrusion for adjusting a mass of the oscillating member, the protrusion extending from the movable element in a direction parallel to the oscillation axis; and projecting a laser beam to a cutting position of the protrusion so as to partly remove the movable element, including a portion of the protrusion ranging from the cutting position to a tip end of the protrusion which portion is not irradiated by the laser beam; wherein an amount of the removal by the laser beam projection is adjusted by controlling the cutting position.

In accordance with a further aspect of the present invention, there is provided a method of producing an oscillator device having an oscillating member, a resilient support and a supporting member, the oscillating member being resiliently supported by the resilient support for oscillation about an oscillation axis, said method being characterized by: forming the oscillating member with a movable element having a plurality of protrusions for adjusting a mass of the oscillating member, the protrusions being disposed at opposite sides of the oscillation axis; and cutting at least one of the protrusions along a cutting line so as to partly remove the movable element, including a portion of the protrusion ranging from the cutting line to a tip end of the protrusion; wherein the position of the cutting line is controlled to adjust a moment of inertia of the oscillating member and an offset distance of a gravity center of the oscillating member from the oscillation axis.

In accordance with a yet further aspect of the present invention, there is provided an oscillator device, comprising: an oscillating member; a resilient support; and a supporting member; wherein said oscillating member is resiliently supported by said resilient support, for oscillation about an oscillation axis; wherein said oscillating member has a movable element and a mass adjusting member for adjusting a mass of said oscillating member; and wherein a cavity is defined between said movable element and a portion of said mass adjusting member.

In accordance with a still further aspect of the present invention, there is provided an oscillator device, comprising: an oscillating member; a resilient support; and a supporting member; wherein said oscillating member is resiliently supported by said resilient support, for oscillation about an oscillation axis; wherein said oscillating member includes a movable element having a protrusion for adjusting a mass of said oscillating member; wherein the protrusion extends from said movable element in a direction parallel to the oscillation axis; and wherein a sectional area of the protrusion along a plane perpendicular to the oscillation axis is constant in the oscillation axis direction.

In accordance with another aspect of the present invention, there is provided an oscillator device, comprising: an oscillating system; and driving means configured to drive said oscillating system; wherein said oscillating system includes a first oscillating member, a first resilient support, a second oscillating member, a second resilient support, and a supporting member; wherein said first oscillating member includes a first movable element having a protrusion for adjusting a mass of said first oscillating member; wherein said second oscillating member includes a second movable element having a protrusion for adjusting a mass of said second oscillating member; wherein, in each of said first and second movable elements, the protrusion extends from that movable element in a direction parallel to the oscillation axis, and a sectional area of the protrusion along a plane perpendicular to the oscillation axis is constant in the oscillation axis direction; wherein said first movable element is resiliently supported by said second movable element through said first resilient support, for oscillation about the oscillation axis; wherein said second movable element is resiliently supported by said supporting member through said second resilient support, for oscillation about the oscillation axis; and wherein said oscillating system has at least two natural oscillation modes having different frequencies.

In accordance with a further aspect of the present invention, there is provided an oscillator device, comprising: an oscillating member; a resilient support; and a supporting member; wherein said oscillating member is resiliently supported by said resilient support, for oscillation about an oscillation axis; wherein said oscillating member includes a movable element having a plurality of protrusions for adjusting a mass of said oscillating member; wherein the protrusions are formed in pairs, each pair being disposed at positions symmetrical with respect to the oscillation axis; wherein those protrusions disposed at symmetrical positions have mutually different shapes; and wherein a gravity center of said oscillating member is placed on the oscillation axis.

In accordance with a further aspect of the present invention, there is provided an oscillator device, comprising: an oscillating system; and driving means configured to drive said oscillating system; wherein said oscillating system includes a first oscillating member, a first resilient support, a second oscillating member, a second resilient support, and a supporting member; wherein said first oscillating member includes a first movable element having a plurality of first protrusions for adjusting a mass of said first oscillating member; wherein said second oscillating member includes a second movable element having a plurality of second protrusions for adjusting a mass of said second oscillating member; wherein said plurality of first protrusions and said plurality of second protrusions are respectively disposed at positions symmetrical with respect to the oscillation axis; wherein those of said plurality of first protrusions and/or said plurality of second protrusions, disposed at symmetrical positions, have mutually different shapes; wherein a gravity center of said first oscillating member and a gravity center of said second oscillating member are placed on the oscillation axis; wherein said first movable element is resiliently supported by said second movable element through said first resilient support, for oscillation about the oscillation axis; wherein said second movable element is resiliently supported by said supporting member through said second resilient support, for oscillation about the oscillation axis; and wherein said oscillating system has at least two natural oscillation modes having different frequencies.

In accordance with a yet further aspect of the present invention, there is provided an image forming apparatus, comprising: a light source; an optical deflector based on an oscillator device as recited above; and a photosensitive member, wherein said optical deflector deflects light from said light source so that at least a portion of the light is incident on said photosensitive member.

In accordance with a still further aspect of the present invention, there is provided an image displaying apparatus, comprising: a light source; an optical deflector based on an oscillator device as recited above; and an image display member, wherein said optical deflector deflects light from said light source so that at least a portion of the light is incident on said image display member.

Briefly, in an oscillator device such as an optical deflector for performing optical scan and a method of producing such oscillator device, an oscillating member may include a movable element and a mass adjusting member, and a cavity may be defined between the movable element and the mass adjusting member. With this arrangement, a relatively large mass can be removed quickly. Furthermore, the movable element may be formed with a protrusion for the mass adjustment, and this assures fast removal of relative large mass. This assures adjustment of a moment of inertial of the oscillating member or a gravity center position thereof, through a large adjustment range and at higher speed.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1A is a plan view of an optical deflector according to a first working example of the present invention.

FIG. 1B is a plan view of an oscillating system of the first working example, at side where no reflection surface is formed.

FIG. 2 is a sectional view, showing an oscillating member and a driving means in the first working example of the present invention.

DESCRIPTION OF THE PREFERRED EMBODIMENTS

Figure 3:
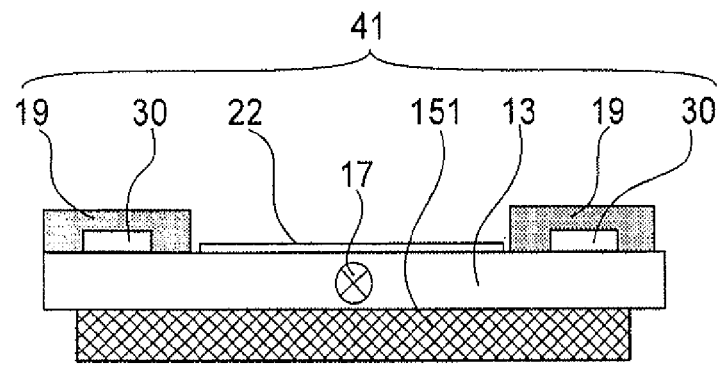
FIG. 3 is a sectional view, showing an alternative structure of the oscillating member according to the first working example of the present invention.

Preferred embodiments of the present invention will now be described with reference to the attached drawings.

One preferred embodiment of the present invention will be described below. An oscillator device according to this embodiment may have at least one oscillating member provided to oscillate about an oscillation axis. The oscillating member may include a movable element having a mass adjusting member for adjusting the mass of the same. A cavity may be defined between the movable element and the mass adjusting member. With this cavity, a portion of the mass adjusting member can be kept spaced from the movable element. The cavity may be a recess or notch formed in the movable element or in the mass adjusting member.

The oscillator device may comprise an oscillating system and a driving means for driving the oscillating system. The oscillating system may comprise an oscillating member such as described above, a supporting member and a resilient support. The movable member may be resiliently supported by the resilient support, for oscillation about the oscillation axis relative to the supporting member. The movable element may have a reflection surface (light deflecting element), to provide an optical deflector.

In a method of producing an oscillator device such as described above, in order to perform at least one of the adjustment of the frequency of at least one natural oscillation mode about the oscillation axis for matching the same with a target frequency and the adjustment and alignment of the gravity center position of the oscillating member with respect to the oscillation axis, the following procedure may be done. For example, a portion of the mass adjusting member hanging over a cavity may be cut off by means of a laser beam. With regard to the shape of the portion of the mass adjusting member, hanging over the cavity, a portion of the mass adjusting member may extend across the cavity or it may partly extend over the cavity as a protrusion. In the latter case, once the position (distance from the oscillation axis) and the mass of the protrusion are set, the amount of adjustment of the inertia moment or gravity center position to be achieved by cutting off the protrusion (e.g., by cutting a base of the protrusion by use of a laser beam) can be predetected. Where a plurality of cavities and protrusions such as described are provided, the inertia moment or gravity center position can be adjusted very precisely and quickly.

Particularly, in this embodiment, the mass adjusting member may be provided on the movable element, and this doesn't need to enlarge the surface area of the movable element. Hence, the mass adjusting member can be provided without increasing the air resistance during oscillation of the movable element about the oscillation axis.

In a method of manufacturing an oscillator device according to another embodiment of the present invention, a laser beam may be projected onto the portion of the mass adjusting member, spaced from the movable element, while scanningly deflecting the laser beam along a loop-like shape (closed curve shape) such as circumferentially, for example, to remove the material of the mass adjusting member as irradiated with the laser beam to provide the oscillating member. Since the region of the mass adjusting member encircled by the closed loop (this region has not been irradiated with the laser beam) is spaced from the movable element, it is removed off. This means that, out of the inertia moment of the oscillating member about the oscillation axis, the inertia moment amount created by the removed portion is subtracted. Alternatively, due to diminishment of the mass corresponding to the removed portion, the gravity center position is adjusted.

In this manner, the frequency of the natural oscillation mode of the oscillating system or the gravity center position of the same can be controlled as desired. Namely, by suitably choosing the volume and position of the portion to be removed out of the mass adjusting member, the inertia moment or gravity center position can be adjusted as desired. Particularly, by appropriately selecting the density of the mass adjusting member (for example, by keeping the specific gravity or relative density of the mass adjusting member small), the resolution of the frequency adjustment can be chosen as desired irrespective of the resolution for the volume to be removed or resolution for the positioning. Furthermore, because of the presence of the cavity, when the laser beam is projected to remove the mass just along a closed curve, the portion of the mass adjusting member encircled by the closed curve can be removed at the same time. Therefore, a large mass can be removed fast.

This assures adjustment of the inertia moment or gravity center position, with a relatively large adjusting range and at higher speed. Furthermore, because of the presence of the cavity, only the mass adjusting member can be removed accurately by the laser beam irradiation without removing any of the movable element material. Hence, high-precision adjustment is assured. Namely, without such a cavity, during the laser beam irradiation, a portion of the movable element right under the mass adjusting member may possibly be removed. The provision of the cavity assuredly avoids it.

An oscillator device having an oscillating member arranged to oscillate about an oscillation axis may be embodied as follows. In this embodiment, the oscillating member may comprise a movable element having a protrusion for adjusting the mass of the oscillating member. Namely, in this embodiment, the mass adjusting member may not be provided separately, but rather, a portion of the movable element itself may be used to take the role of the mass adjusting member. With regard to the shape of such protrusion, examples may be a protrusion extending in a direction parallel to the oscillation axis, and a protrusion extending in a direction perpendicular to the oscillation axis. As an alternative, the movable element may be shaped into a trapezoidal shape or spindle-like shape, and an acute-angle corner thereof may be used as the protrusion.

Particularly, with regard to a protrusion extending in a direction parallel to the oscillation axis, by adjusting the cutting position whereat the laser beam is going to be projected, the amount of removal from this cutting position to the tip end of the protrusion is made adjustable.

Furthermore, in accordance with this embodiment, the size of the laser beam machining region can be constant and small, irrespective of whether the removing amount is large or small. Therefore, even if the removing amount is enlarged, heat transfer to the oscillator device due to the laser beam machining can be kept small.

Furthermore, by fine adjustment of the cutting position, the resolution for the removing amount can be improved. Thus, a large adjusting range and accurate resolution are accomplished at the same time. Furthermore, with respect to a section perpendicular to the oscillation axis, the protrusion may have a uniform sectional shape, being uniform in the oscillation axis direction. In that occasion, the length from the cutting position to the tip end of the protrusion and the amount of inertia moment adjustment of the oscillating member about the oscillation axis will have an approximately proportional relationship. Hence, the inertia moment can be adjusted very easily.

All the projections may extend in a direction parallel to the oscillation axis. In that case, as compared with a case where the projections extend in a direction perpendicular to the oscillation axis, unstableness of the displacement angle or phase of oscillation is reduced. This is because such unstableness is attributable to variation of resistance which is applied to the oscillating member from the surrounding air. Particularly, in oscillator devices of a very small size of about a few millimeters, the variation of air resistance is a very serious problem and it is quite notable if the device has a portion far remote from the oscillation axis (displacement speed is high). When all the protrusions are made parallel to the oscillation axis, both the scan stability and quick adjustment of inertia moment are accomplished at the same time. This is effectively obtainable even in a case where a protrusion is formed only at a position of the oscillating member, most remote from the oscillation axis.

Through a microprocessing procedure based on the semiconductor manufacturing technology, the movable element and protrusion of the oscillating member can be produced monolithically. Hence, an oscillating member having an inertia moment adjusting mechanism can be produced very precisely.

An oscillator device may comprise an oscillating system having two oscillating members arranged to oscillate about an oscillation axis, and a driving means for driving the oscillating system. In this embodiment, the first oscillating member may comprise a first movable element having a protrusion extending in a direction parallel to the oscillation axis. Similarly, the second oscillating member may comprise a second movable element having a protrusion extending in a direction parallel to the oscillation axis. With regard to a section to which the oscillation axis functions as a normal (i.e., a section perpendicular to the oscillation axis), the sectional area of each protrusion formed at the first and second oscillating members is constant in the direction of the oscillation axis. The oscillating system may have two natural oscillation modes about the oscillation axis. In this embodiment, by adjusting the cutting position of the protrusions of the first and second movable elements, respectively, whereat the laser beam is going to be projected, the removal amount can be adjusted.

Since both of the first and second oscillating members have a protrusion extending in parallel to the oscillation axis which is a common axis of the oscillating system, the same cutting direction can be used for the first and second movable elements. Hence, the cutting device is simplified.

In a method of producing an oscillator device such as described above, in order to perform both of the adjustment of the frequency of at least one natural oscillation mode about the oscillation axis for matching the same with a target frequency and the adjustment of the gravity center position of the oscillating member at the same time, the following procedure may be done. A portion of a protrusion projecting from the movable element may be cut off. For example, it may be cut off by using a laser beam. By adjusting the cutting position whereat the laser beam is going to be projected, the amount of removal from the cutting position to the tip end of the protrusion can be adjusted. A plurality of protrusions may be formed at symmetrical positions with respect to the oscillation axis, initially with symmetrical shapes. Normally, those protrusions which are provided in pair have different removal amounts and, thus, the final shape of them is different.

By removing at least a portion of the protrusion, the inertia moment of the oscillating member can be adjusted in accordance with the removed amount. Furthermore, due to the asymmetric relation of the removed amounts of the paired protrusions, the offset distance of the gravity center of the oscillating member from the oscillation axis is adjustable at the same time. Also in this case, similar advantageous results attainable by removing a protrusion as described above may be obtainable. Furthermore, since the inertia moment, gravity center and offset distance are all adjustable at the same time by using the same protrusion, the process can be made very fast. Additionally, the number of protrusions for the adjustment can be small, and hence the inertia moment and mass of the oscillating member can be made small. Therefore, the oscillator device as a whole can be made compact. Since the air resistance applied to the oscillating member during oscillation is small, the stability of oscillation of the oscillating member is improved significantly.

An oscillator device having an oscillating member arranged to oscillate about an oscillation axis may be embodied as follows. In this embodiment, all protrusions of the oscillator device may extend in parallel to the oscillation axis, and the sectional area perpendicular to the oscillation axis may be constant in the oscillation axis direction. Those protrusions disposed at symmetrical positions with respect to the oscillation axis may have mutually different lengths.

In accordance with this embodiment, the sum of the removed lengths relates to the amount of adjustment of the inertia moment, while the ratio of the removed lengths of the protrusions relates to the amount of adjustment of the offset distance of the gravity center of the oscillating member from the oscillation axis. Therefore, with regard to the shape to be removed from each protrusion, once the total amount is determined based on the amount of inertia-moment adjustment and the ratio of removed lengths is determined based on the amount of offset-distance adjustment, both the inertia moment and the offset distance of the gravity center can be adjusted at the same time. Here, the amount of inertia-moment adjustment and the total amount of removed lengths are in a proportional relationship. Therefore, the amount of inertia-moment adjustment and the amount of gravity-center offset distance adjustment can be determined very easily and precisely.

Also in this case, similar advantageous results attainable by the protrusion parallel to the oscillation axis are obtainable. Again, through a microprocessing procedure based on the semiconductor manufacturing technology, the movable element and plural protrusions of the oscillating member can be produced monolithically. Hence, a structure that enables high-precision adjustment of the inertia moment and the offset distance of the gravity center is provided conveniently.

An oscillator device having an oscillating member arranged to oscillate about an oscillation axis may be embodied as follows. In this embodiment, a permanent magnet as a driving means may be disposed at a movable element, so that, in response to an electromagnetic force applied from a coil disposed outside the oscillating system, the movable element having a magnet may be driven. In this embodiment, the permanent magnet may be disposed at the movable element, and the gravity center of the permanent magnet may possibly be offset from the oscillation axis. For example, due to a process error, the setting position of the permanent magnet may deviate at random, causing an offset of the gravity center. However, by removing at least a portion of the protrusion formed at the movable element, in a similar manner as described above, the gravity center of the movable element may be offset from the oscillation axis, to assure that the gravity center offset of the permanent magnet is cancelled by the gravity center offset of the movable element. Namely, by removing at least a portion of the protrusion in the following manner, these offsets are mutually cancelled. That is, the protrusion may be removed so that the ratio between (i) the distance from the gravity center of the permanent magnet to the point of intersection between the oscillation axis and a line segment that connects the gravity centers of the permanent magnet and the movable element and (ii) the distance from the gravity center of the movable element to the aforementioned point of intersection, becomes approximately equal to the ratio of inverses of the masses of the permanent magnet and the movable element. With this procedure, the gravity center of the oscillating member as a whole can be placed on the oscillation axis.

As described above, in a small-size oscillator device including a driving means based on an electromagnetic force capable of driving an oscillating member largely, the adjustment of the frequency and the adjustment of the offset distance of the gravity center can be made at the same time. The magnetic characteristic of the permanent magnet is easily degraded by heat. In consideration of this, the above-described embodiment in which a larger removal amount does not need enlargement of the machining region is quite advantageous in the point that heat transfer due to the laser beam machining is made small and that a movable element having a permanent magnet with good magnetic characteristic is accomplished.

An oscillator device which may be a little different from the preceding embodiments may comprise an oscillating system, including two oscillating members disposed to oscillate about an oscillation axis, and a driving means for driving the oscillating system. In this embodiment, a first oscillating member may comprise a first movable element having a plurality of protrusions extending in a direction parallel to the oscillation axis. Similarly, a second oscillating member may comprise a second movable element having a plurality of protrusions extending in a direction parallel to the oscillation axis. The oscillating system may have two natural oscillation modes about the oscillation axis. By adjusting the cutting position of each protrusion of the first and second movable elements, whereat the laser beam is going to be projected, the amount of removal of these protrusions can be adjusted. Since both of the first and second oscillating members have protrusions extending in parallel to the oscillation axis which is a common axis of the oscillating system, the same cutting direction can be used for the first and second movable elements. Hence, the cutting device is simplified.

In an embodiment wherein, as described hereinbefore, the oscillating member comprises a movable element having a mass adjusting member for adjusting the mass thereof and a cavity is defined between the movable element and the mass adjusting member, the frequency adjustment and the offset-distance adjustment for the gravity center can be made simultaneously, in the following manner. Namely, mass adjusting members may be disposed at the opposite sides of the oscillation axis, and the amount of removal of these mass adjusting members as well as the distance of the same from the oscillation axis may be determined as described above, based on the amount of inertia-moment adjustment and the amount of offset-distance adjustment of the gravity center. Then, based on this determination, a portion of the mass adjusting members may be removed. With this procedure, the frequency adjustment and the gravity-center offset distance adjustment can be made simply and very precisely.

The movable element may be provided with a reflection surface to constitute an optical deflector, and it may be used as an optical deflector being well tuned to a desired frequency or gravity center offset amount, for image formation or image display. If the frequency of the natural oscillation mode is well tuned, since such optical deflector can be driven with a high amplitude amplification factor, the device can be compact and can be driven with lower power consumption. On the other hand, if the amount of gravity center offset from the oscillation axis is well tuned, the oscillation axis hardly shifts during the scan. Hence, degradation of the performance such as curvature of the scan line or lowered reproducibility is well avoided.

An image forming apparatus using such optical deflector may comprise a light source, an optical deflector such as described above, and a photosensitive member, wherein the optical deflector may deflect light from the light source so that at least a portion of the light may be incident on the photosensitive member.

An image displaying apparatus using such optical deflector may comprise a light source, an optical deflector such as described above, and an image display member, wherein the optical deflector may deflect light from the light source so that at least a portion of the light is incident on the image display member.

Particularly, an oscillating system may comprise two oscillating members and a reflection surface may be provided at a movable element of one of the oscillating members to provide an optical deflector. In such embodiment, for image formation or image display, an optical deflector having two natural oscillation modes about the oscillation axis well tuned to a double or triple frequency relationship is usable. Such optical deflector is advantageous not only in that it can be driven with a large amplitude amplification factor but also in that, through a combined-wave drive based on sinusoidal waves in the aforementioned frequency relationship, the uniformness of the angular speed of the optical scan is improved. Therefore, deformation of the reflection surface due to a change in the angular speed during the oscillation is well avoided. Furthermore, since the modulation timing of the light source for light spot formation can be set without caring about the non-uniformness of angular speed, the modulation circuit is simplified.

Furthermore, if the gravity-center offset amount is well tuned, unwanted oscillation fluctuation which might result from the coupling that obstructs the independency of two natural oscillation modes of the oscillating system is well reduced. Such oscillation fluctuation can be reduced by decreasing the offset amount of the gravity center and by tuning the frequencies of the two natural oscillation modes into a "multiple by an integer" relationship. Since such oscillation fluctuation may cause changes of angular speed of the oscillating member about the oscillation axis and lead to unstableness of optical scanning, they should be avoided.

Next, specific working examples of the present invention will be described with reference to the drawings.

First Working Example

FIGS. 1A, 1B and 2 show an optical deflector according to a first working example of an oscillator device of the present invention. FIG. 1A is a plan view of the optical deflector, and FIG. 1B is a plan view of an oscillating system as seen from the back of FIG. 1A. FIG. 2 is a sectional view taken along a line A-A in FIG. 1A. In this working example, a pair of mass adjusting members 19, a reflection surface 22 and a pair of cavities 30 are formed at the movable element 11 to constitute an oscillating member 41. The oscillating system comprises this oscillating member 41, a pair of resilient supports 12 and a supporting member 13.

First of all, referring to these drawings, the driving principle in this working example will be explained below, together with the structure thereof. In this example, the oscillating system shown in FIGS. 1A and 1B makes torsional oscillation about the oscillation axis 17, through driving means to be described later. The movable element 11, resilient supports 12, and supporting member 13 are integrally made from a monocrystal silicon substrate by means of a photolithographic process and an etching process according to the semiconductor manufacturing method. Hence, a quite small oscillating system can be produced relatively inexpensively. Furthermore, since monocrystal silicon has a high Young's modulus and a small density, deformation due to the self-weight of the movable element is very small. Therefore, an oscillating system having a large amplitude amplification factor during the resonance is accomplished. In this working example, the movable element 11 has a size 3 mm in a direction perpendicular to the oscillation axis 17 and a size 1 mm in a direction parallel to that axis. The whole length of the oscillating system is about 12 mm.

The movable element 11 is resiliently supported by the paired resilient supports 12, for torsional oscillation about the oscillation axis 17. The paired mass adjusting members 19 and paired cavities 30 are disposed at opposite sides of the oscillation axis 17.

The reflection surface 22 formed at the movable element 11 serves to scanningly deflect the light from a light source in response to the torsional oscillation of the movable element 11. The reflection surface 22 is made of aluminum and formed by vacuum vapor deposition. This reflection surface may be made of any other materials such as gold or copper, for example. A protection film may be formed at the topmost surface thereof. Here, since the movable element 11 should be formed with this reflection surface 22, the flatness thereof during driving is particularly important. The movable element 11 of this example is supported at its opposite ends by means of the paired resilient supports (torsion springs) 12. Hence, as compared with the single-spring support, deformation due to the self-weight thereof is well avoided, and better flatness can be maintained.

In FIG. 2, a stationary member 150 and driving means are illustrated. As shown in the drawing, the driving means of this working example comprises a fixed coil 152 fixed to the stationary member 150, and a permanent magnet 151 provided on the back of the movable element 11 of the oscillating member 41. As shown in FIGS. 1B and 2, the permanent magnet 151 of the oscillating member 41 is a metal magnet of prism-like shape having a length of about 2 mm and a sectional size of 150 µm×150 µm, for example. The permanent magnet 151 has its polarization (magnetization) direction extending along its lengthwise direction, and it is fixed to the movable element 11 by an adhesive agent.

As seen from FIG. 2, the stationary member 150 serves to appropriately hold the position of the oscillating system and permanent magnet 151 as well as the position of the fixed coil 152. In response to application of a driving AC current, the fixed coil 152 produces an alternating magnetic field in the direction of an arrow H shown in FIG. 2. Since the magnetic flux density direction of the permanent magnet 151 is in the direction of an arrow B, the magnetic field produced by the fixed coil 152 generates a torque about the oscillation axis 17, and the oscillating system is driven thereby.

Next, the driving principle of the optical deflector according to this working example will be explained in greater detail. With regard to the torsional oscillation about the oscillation axis 17, the oscillating system of this example has a natural oscillation mode of a frequency $f_1$. This natural oscillation mode can be specified by calculation based on the relation of Equation (1) below which expresses the frequency of the natural oscillation mode of the torsional oscillation system, where I is the moment of inertia of the oscillating member 41 about the oscillation axis 17, and K is the spring constant of the paired resilient supports 12 about the oscillation axis 17.

$$f_1 = 1/2\pi \cdot \sqrt{(K/I)} \qquad (1)$$

wherein $\sqrt{(K/I)}$ means "square root of (X/I)". Equation (1) above provides a sufficient approximation if the damping term of the oscillating system (e.g., air resistance) is small. The damping ratio of the oscillating system of this working example is about 0.003. The fixed coil 152 drives the oscillating system in accordance with a reference frequency $f_0$ which is a target driving frequency determined by the specifications of the optical deflector as applied. If the frequency $f_1$ matches the reference frequency $f_0$, the oscillation system can be driven at the highest amplitude amplification factor point of the natural oscillation mode.

However, due to various error factors such as dispersion of physical property of the material or process tolerance, for example, the frequency $f_1$ may shift from the reference frequency $f_0$. In consideration of this, the mass adjusting member 19 is partly removed to adjust the inertia moment I of the oscillating member 41 in Equation (1) to thereby tune the frequency $f_1$ so that it matches the reference frequency $f_0$. In this working example, the mass adjusting members 19 are provided by adhering aluminum planar plates to the movable element 11 as shown in FIGS. 1A, 1B and 2.

As described hereinbefore, the adjusting amount of inertia moment can be increased or decreased based on the volume of the portion removed from the mass adjusting member 19 and the distance of the same from the oscillation axis 17. For example, while a certain error range of the frequency $f_1$ is supposed, the inertia moment I and the spring constant K may be so set that the frequency $f_1$ with this error range is kept lower than the reference frequency $f_0$. By doing so, the frequency $f_1$ can be tuned to the reference frequency $f_0$. As an example, prior to partly removing the mass adjusting member 19, the oscillation amplitude of the movable element 11 may be measured while sweeping the driving frequency. A suitable removal amount as required can be determined by this. Here, by appropriately setting the density of the mass adjusting member 19, the adjustment resolution for the frequency $f_1$ can be set independently from the resolution regarding the volume of the portion to be removed and the distance of the same from the oscillation axis 17.

Furthermore, in this working example, the mass adjusting members 19 are disposed on the surface of the planar platelike movable element 11 at a side opposite to the side where the permanent magnet 151 is mounted. This structure effectively reduces any shift of the gravity center of the oscillating member 41 from the oscillation axis 17 and reduces unwanted oscillation. Moreover, by partly removing the mass adjusting member 19, any shift of the gravity center of the oscillating member 41 from the oscillation axis 17 can be reduced. As an example, an observation laser beam may be projected onto the reflection surface 22 and, by observing the locus of scan, the locus of torsional oscillation about the oscillation axis 17 may be observed. Then, by partly removing the mass adjusting members 19 so as to reduce unwanted oscillation, the gravity center deviation can be well reduced.

Next, the process of partly removing the mass adjusting member 19 will be explained in detail, with reference to the drawings. The movable element 11 of this working example is formed with cavities 30 which, as shown in FIG. 1B, are defined by throughbores. With the provision of these cavities 30, as seen in FIG. 2, the mass adjusting members 19 have a region which is not adhered to the movable element 11. These cavities 30 are formed simultaneously as the oscillating system is produced from a monocrystal silicon substrate, by dry etching.

Figure 7A:
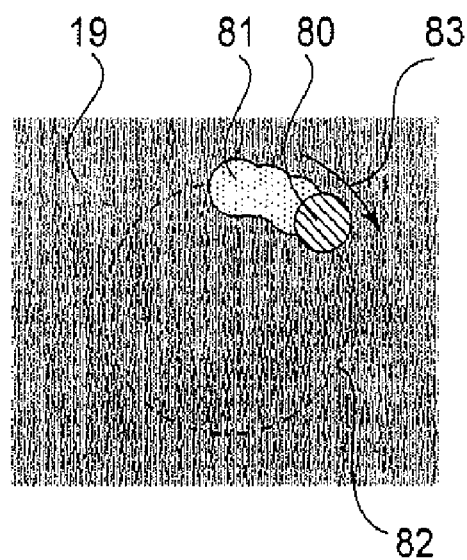
FIG. 7A is a plan view for explaining one process of laser beam machining processes according to the present invention.
Figure 7B:
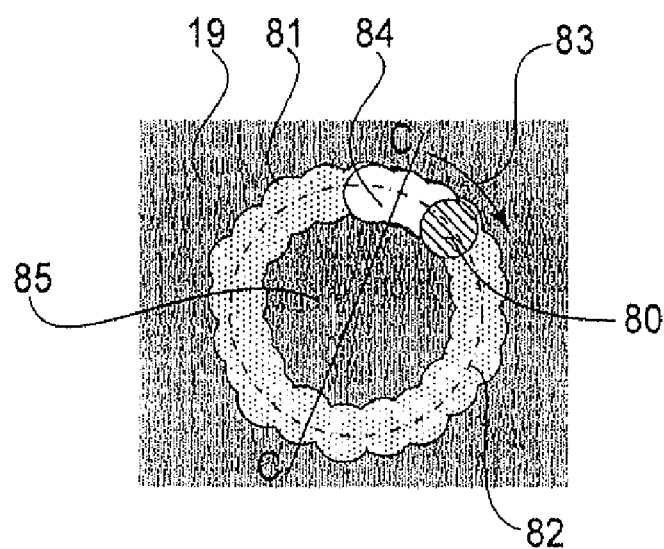
FIG. 7B is a plan view for explaining another process of laser beam machining processes according to the present invention.
Figure 7C:
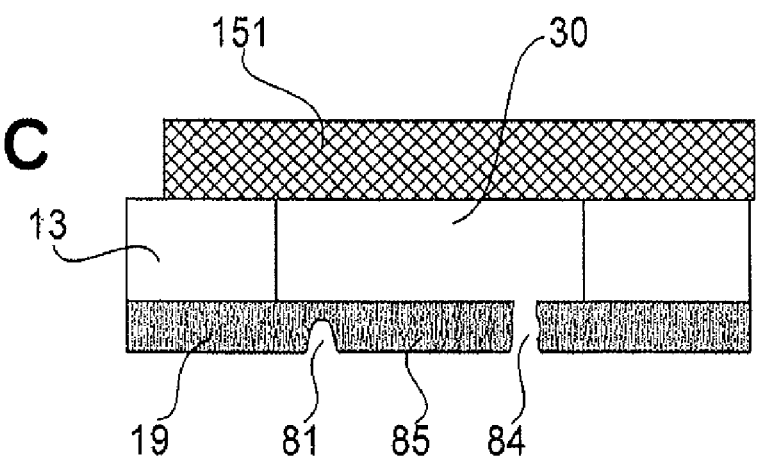
FIG. 7C is a sectional view for explaining the process corresponding to FIG. 7B.

FIGS. 7A-7C are schematic views for explaining the process of partly removing the mass adjusting member 19 in this working example. In this working example, a pulse laser is projected onto the portion of the mass adjusting member 19 to be machined, by which the mass is partly removed. FIG. 7A is a plan view of the sample in the initial stage of the laser beam machining. FIG. 7B is a plan view showing the state in which the procedure has advanced from the state of FIG. 7A. FIG. 7C is a section taken along a line C-C in FIG. 7B. It is seen from FIG. 7C that, due to the presence of the cavity 30, the mass removal portion 85 which is a portion of the non-adhered region of the mass adjusting member, not adhered to the movable element 11, can be removed finally.

First of all, as shown in FIG. 7A, a machining laser beam spot 80 is scanningly shifted along a machining locus 82 so as to trace an arcuate loop (closed curve) in the rotational direction 83. The machining laser beam spot 80 is being emitted with an output and a pulse frequency suited to the machining of the mass adjusting member 19. As shown, by means of this machining laser spot 80, a machined portion 81 along the machining locus 82 is formed.

FIG. 7B illustrates the state after the machining laser spot 80 has circulated by appropriate times along the machining locus 82. As shown, there is a through-opening 84 formed along the machining locus 82. FIG. 7C shows this in section. The machining laser beam spot 80 further circulates along the machining locus 82 so as to remove the periphery of the mass removal portion 85 along an arcuate loop. Since the mass removal portion 85 is not adhered to the movable element 11 due to the presence of the cavity 30, as shown in FIG. 7C, with the procedure described above it is separated and removed from the movable element 11.

In the procedure described above, if the diameter of the machining locus 82 is enlarged, a larger amount of mass can be removed at higher speed. As a matter of course, the shape of the machining locus 82 is not limited to an arcuate loop described above.

In accordance with this working example as described above, due to the effect of the presence of the cavity 30, a volume much larger than the volume as removed by being directly irradiated with the laser beam can be removed fast. This enables enlargement of the frequency adjustable range for the natural oscillation mode and the gravity position adjustable range of the oscillating system, as well as high-speed adjustment. Furthermore, the provision of the cavity 30 enables removal of only the mass adjusting member 19 by the laser beam machining without removing any portion of the movable element 11. As a result of this, adjustment of the natural oscillation mode frequency of the oscillating system and the gravity center adjustment of the same can be made very precisely.

Furthermore, because of the provision of the cavity 30 as a throughbore formed in the movable element 11 as in this working example, the mass adjusting member 19 can have a planar shape. This facilitates the assembling for adhesion. The mass adjusting member 19 in this working example may be made of a material such as metal, dielectric material or semiconductor, for example, which absorbs the machining laser beam.

The movable element 11 and the mass adjusting member 19 of this working example may have a shape such as shown in FIG. 3. FIG. 3 is a section taken along a line A-A in FIG. 1A. As compared with the example of FIG. 2, in the structure shown in FIG. 3, the cavities 30 are formed in the mass adjusting members 19. Even in such case, similar advantageous effects are obtainable in regard to the mass removal using laser beam irradiation.

The oscillator device according to this working example of the present invention has been described with regard to an optical deflector for reflecting and deflecting light. However, it may be applied to a sensor or the like for detecting the amount of deposition of something thereupon, based on measuring a change in the driving frequency due to the deposition of any external mass on the movable element 11.

Furthermore, although the working example described above has been explained with reference to a case wherein the oscillating system has one natural frequency mode about the oscillation axis 17, the oscillating system may have plural oscillating members resiliently supported in series for torsional oscillation about the oscillation axis 17, such that the oscillation system may have plural natural oscillation modes. Even in that occasion, by adjusting the moment of inertia of the respective oscillating members in accordance with the manufacturing method described above, the frequencies of these natural oscillation modes can be adjusted respectively. Furthermore, by adjusting the gravity centers of these oscillating members, unwanted oscillation can be well reduced.

Second Working Example

Figure 4A:
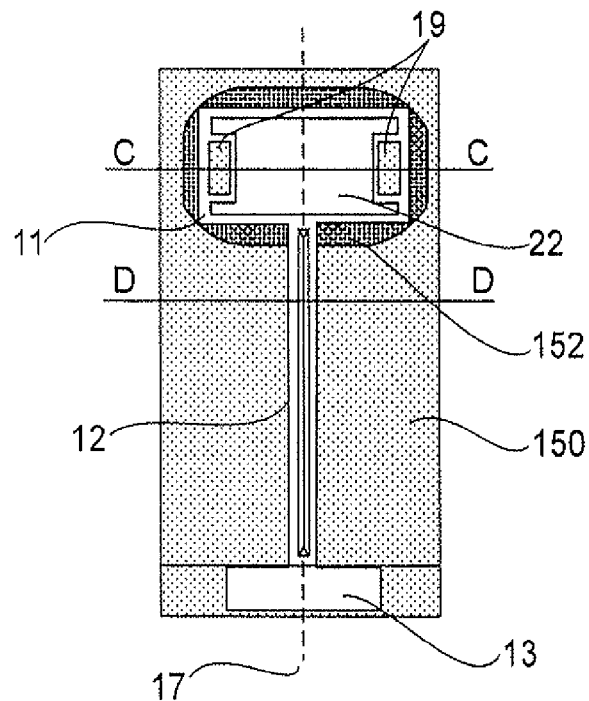
FIG. 4A is a plan view of an optical deflector according to a second working example of the present invention.
Figure 4B:
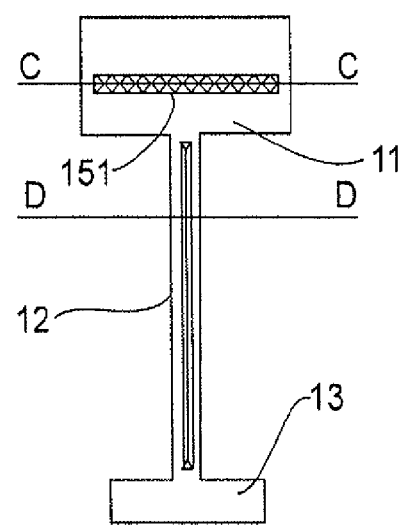
FIG. 4B is a plan view of an oscillating system of the second working example, at side where no reflection surface is formed.
Figure 5:
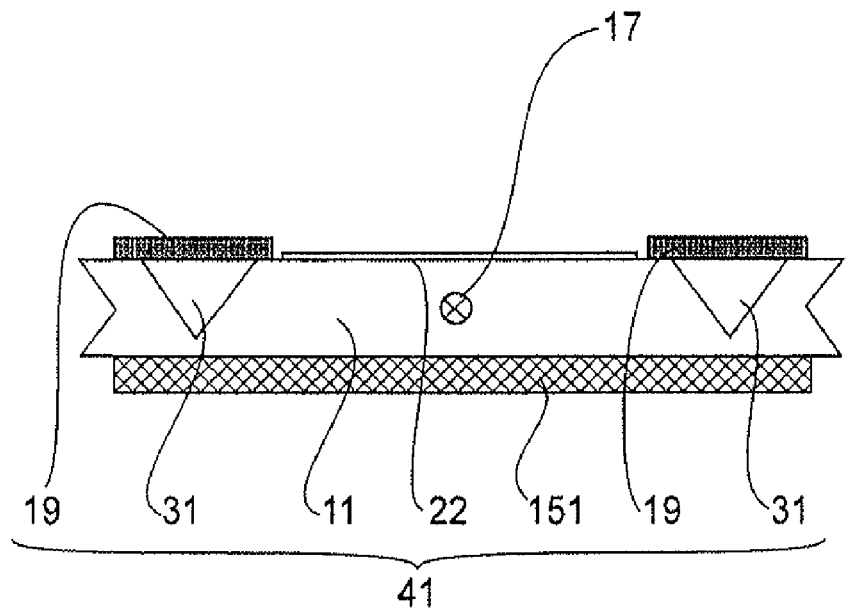
FIG. 5 is a sectional view for explaining an oscillating member in the second working example of the present invention.
Figure 6:
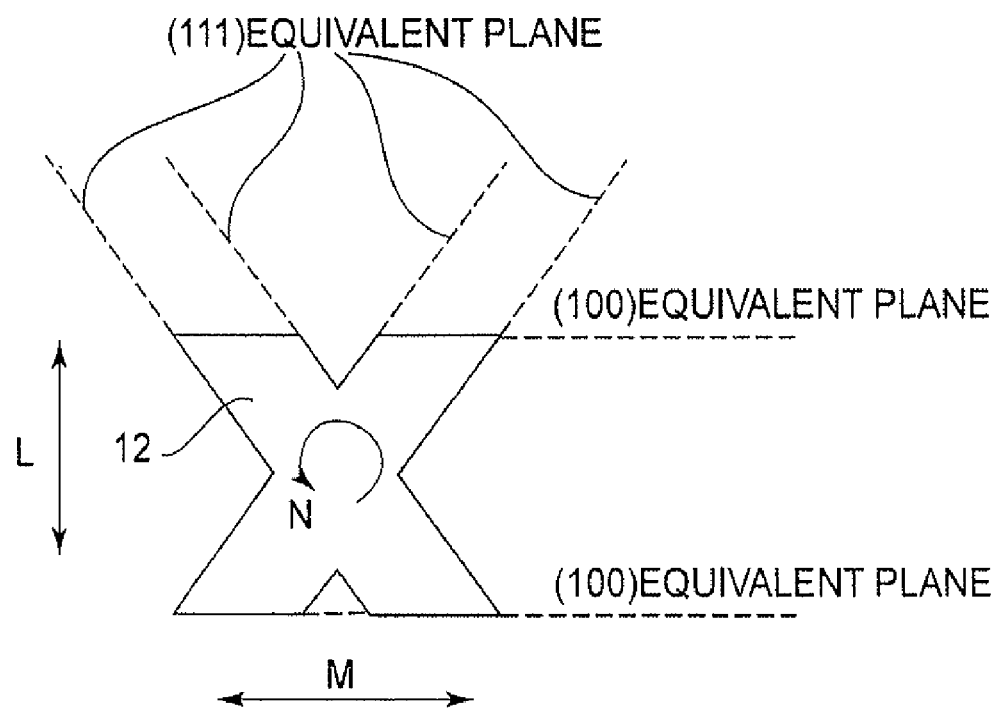
FIG. 6 is a sectional view for explaining a resilient support in the second working example of the present invention.

FIGS. 4A, 4B, 5 and 6 show an optical deflector according to a second working example of an oscillator device of the present invention. FIG. 4A is a plane view, and FIG. 4B is a plan view of an oscillating system as seen from the back of FIG. 4A. FIGS. 5 and 6 are sectional views taken along a line C-D and a line D-D in FIGS. 4A and 4B, respectively. In these drawings, the components having a similar function as those of the first working example are denoted by like numerals. Hereinafter, description of those portions having a similar function as the first working example will be omitted, and only distinctive features wile be explained in detail.

As shown in FIGS. 4A and 4B, the optical deflector of this working example uses only one resilient support 12, and the oscillating system is supported by the stationary member 150 with a cantilever structure.

Furthermore, in this working example, the mass adjusting members 19 are made of resin and they are disposed on the surface of the planar plate-like movable element 11 at a side opposite to the side where the permanent magnet 151 is mounted. As a result, it is easy to reduce any shift of the gravity center of the oscillating member 41 from the oscillation axis 17 and to reduce unwanted oscillation. Namely, as shown in FIG. 5, the permanent magnet 151 and the mass adjusting members 19 are disposed at the opposite surfaces of the movable element 11, sandwiching the oscillation axis 17. Therefore, any deviation of the gravity center of the oscillating member 41 from the oscillation axis 17 which might result from the provision of the mass adjusting members 19 can be reduced effectively.

The movable element 11, resilient support 12 and supporting member 13 that constitute the oscillating system of this working example are integrally made from monocrystal silicon by anisotropic etching using an alkali aqueous solution to be described later. In this example, as shown in FIGS. 5 and 6, the movable element 11 and the resilient support 12 have a characteristic shape as surrounded by crystal equivalent planes (surfaces) of monocrystal silicon.

As shown in FIG. 5, the movable element 11 of this working example is formed with notches 31 extending in parallel to the oscillation axis 17. These notches 31 have a similar effect as the cavities 30 of the first working example, in the process of partly removing the mass adjusting member 19 by a laser beam. By selecting the distance, from the oscillation axis 17, and volume of the mass portion to be removed, for example, the relationship between the removed mass and the removed inertia moment can be changed. Therefore, the gravity center position of the oscillating member 41 can be brought into alignment with the oscillation axis 17, while tuning the frequency of the natural oscillation mode.

Furthermore, with the provision of these notches 31 as the cavities, since these cavities can be defined only by using a planar member as the mass adjusting member 19, the assembling for adhesion is very easy. Yet further, since there is no cavity at the back remote from the surface where the notches 31 are formed, the back surface as a whole can be used as the reflection surface, except the region where the permanent magnet 151 is mounted.

On the other hand, as shown in FIG. 6, the resilient support 12 has an X-shaped sectional shape surrounded by (100) equivalent planes and (111) equivalent planes of monocrystal silicon. Thus, the resilient support 12 has a large rigidity with respect to the direction of an arrow L and the direction of an arrow M in FIG. 6, but the rigidity in a direction of an arrow N about the oscillation axis 17 is relatively weak. Namely, as a torsional spring, it can be easily twisted around the oscillation axis 17 and is difficult to be flexed in other directions. Hence, unwanted oscillations in the directions of arrows L and M are effectively avoided.

This working example uses only one resilient support 12, and the oscillating system is supported by the stationary member 150 with a cantilever structure. Hence, even if deformation occurs in the stationary member 150 due to a temperature change or any external force, little stress is transmitted from the stationary member 150 to the oscillating system in the direction of the oscillation axis 17. Therefore, any change in the natural oscillation mode frequency resulting from a stress in such axial direction is well avoided. Furthermore, even if the stationary member 150 deforms, it leads to little deformation of the oscillating system. As a result, the gravity center position having been adjusted in alignment with the oscillation axis 17 during the manufacture is unchangeable with a temperature change or by any external force, and therefore unwanted oscillation is reduced irrespective of such temperature change or external force.

Figure 8:
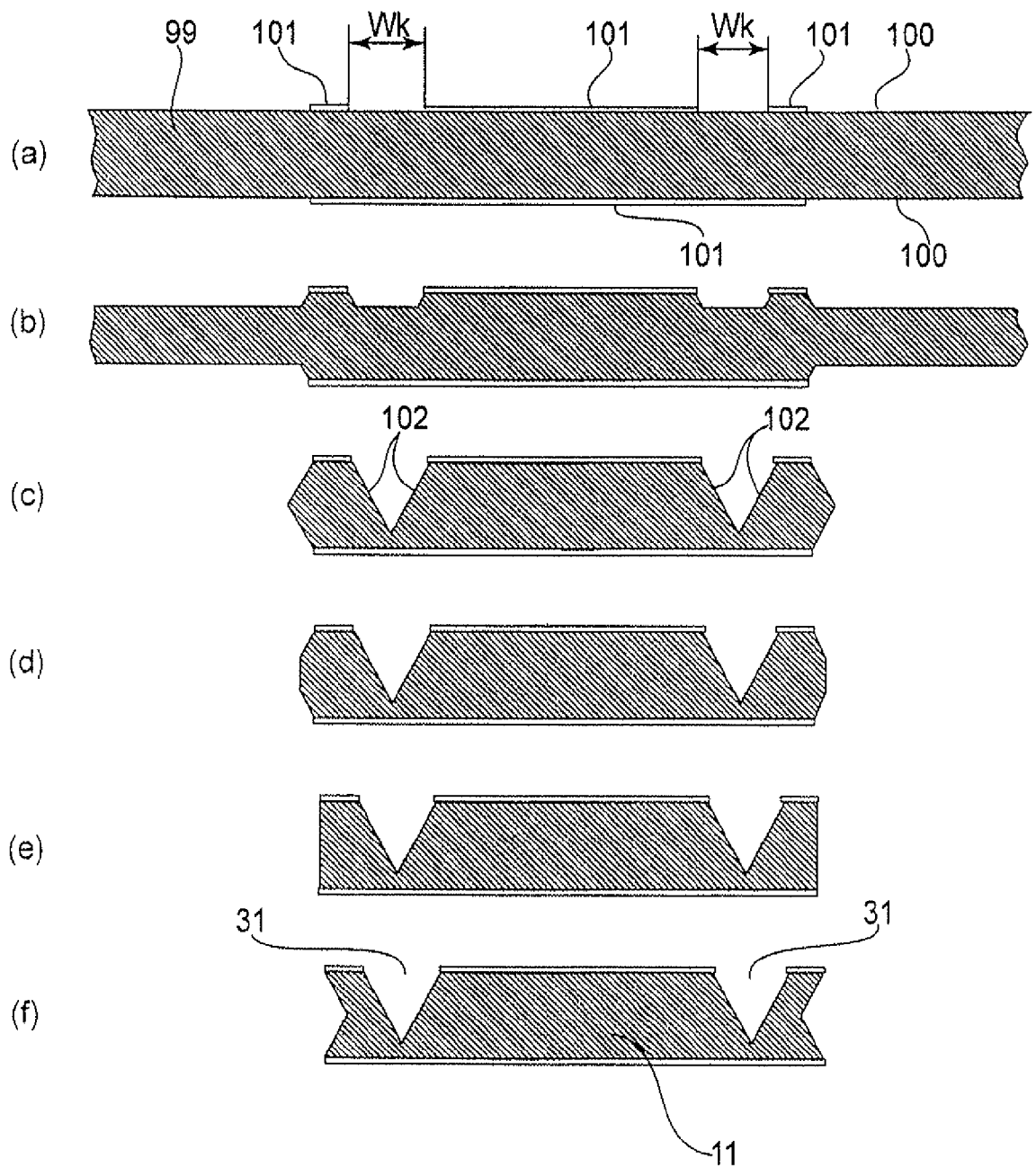
FIG. 8 is a schematic view for explaining the processes for making a movable element with recesses, according to the second working example of the present invention.
Figure 9:
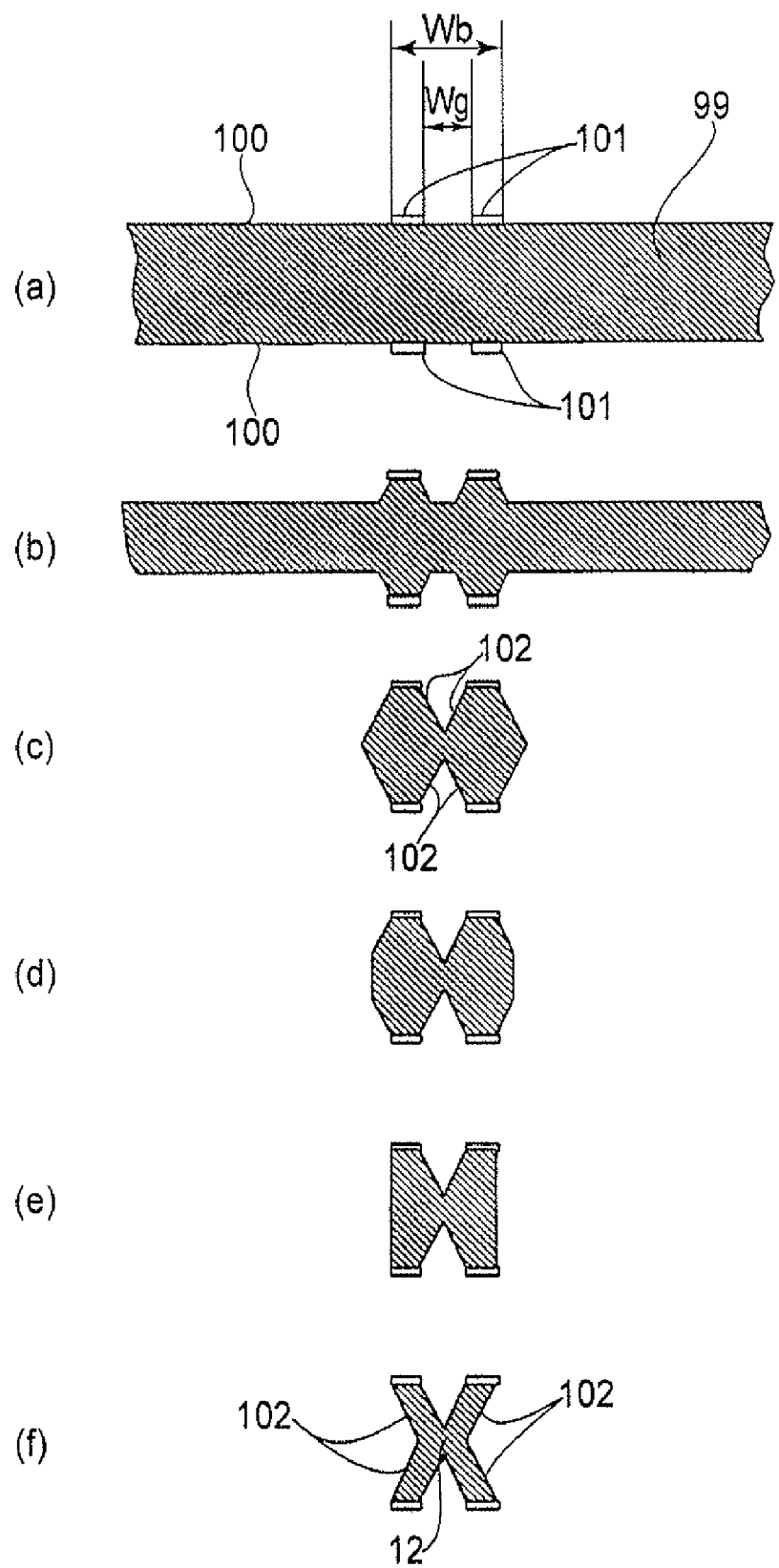
FIG. 9 is a schematic view for explaining the processes for making a torsion spring, according to the second working example of the present invention.

Next, alkali aqueous solution etching process for the movable element 11, resilient support 12 and supporting member 13 in this working example will be explained. FIGS. 8 and 9 show shapes within an alkali aqueous solution, corresponding to the sections of FIGS. 5 and 6. In FIGS. 8 and 9, the sectional shapes at (a) to (f) are at corresponding timings in the process, respectively. First, at (a), a silicon substrate 99 having (100) equivalent planes 100 in the illustrated orientation and having protection films 101 formed thereon is used, and patterning of the protection films 101 is carried out. In this working example, the protection film 101 comprises a silicon nitride film. The silicon nitride film can be formed by using a chemical vapor-phase composing method. Patterns can be formed in the protection films 101 as shown at (a), based on photolithography and dry etching.

Here, as shown in FIG. 8, openings having a width Wk are formed. Also, as shown in FIG. 9, openings of widths Wb and Wg are formed. These widths are determined in accordance with the angle to be defined between the (111) equivalent plane and the (100) equivalent plane and the thickness of the silicon substrate 99. By appropriately setting these widths, the required torsion spring constant and sizes of cavities can be achieved on the basis of the specifications of the oscillating system.

Subsequently, at (b), the substrate is immersed into an alkali aqueous solution to start the etching. This working example used an aqueous solution of potassium hydroxide. Since the alkali aqueous solution such as potassium hydroxide aqueous solution shows a slower etching speed with respect to the (111) equivalent surface of monocrystal silicon than to other surfaces, a shape surrounded by the (111) equivalent surfaces can be produced well. As the etching proceeds, the substrate is etched in the order as depicted at (b) to (f). Finally, at (f), the movable element 11, notches 31, resilient support 12 and supporting member 13, surrounded by the (100) equivalent surfaces 100 and the (111) equivalent surfaces 102, are formed. After that, the protection films 101 at the opposite surfaces are removed by dry etching. Then, a reflection film 22 is formed with a shape shown in FIG. 4A, by vacuum vapor deposition, whereby the oscillating system is provided.

As described above, in this working example, the movable element 11, notches 31, resilient support 12 and supporting member 13 are formed simultaneously by single alkali aqueous solution etching. As a result, the production process is simplified, and the oscillation system can be produced inexpensively.

Particularly, the (111) equivalent surface of monocrystal silicon has a slower etching speed, and this enables precisely forming the shape of the notch 31 and the resilient support 12. With the precision machining of the notches 31, the moment of inertia or gravity center position of the movable element 11 can be determined very precisely. Furthermore, with the precision machining of the resilient support 12, the torsion spring constant can be determined very precisely. This means that the natural oscillation mode frequency and gravity center position of the oscillating system can be determined very precisely. As a result of this, the process of partly removing the mass adjusting member 19 for adjustment of the natural oscillation mode frequency or gravity center position can be carried out at a higher speed. Furthermore, when the area to be occupied by the mass adjusting member 19 is made small and if the mass adjusting member is provided by a small-density material for more accurate frequency adjustment, the resolution for the frequency tuning can be improved more.

Third Working Example

Figure 10A:
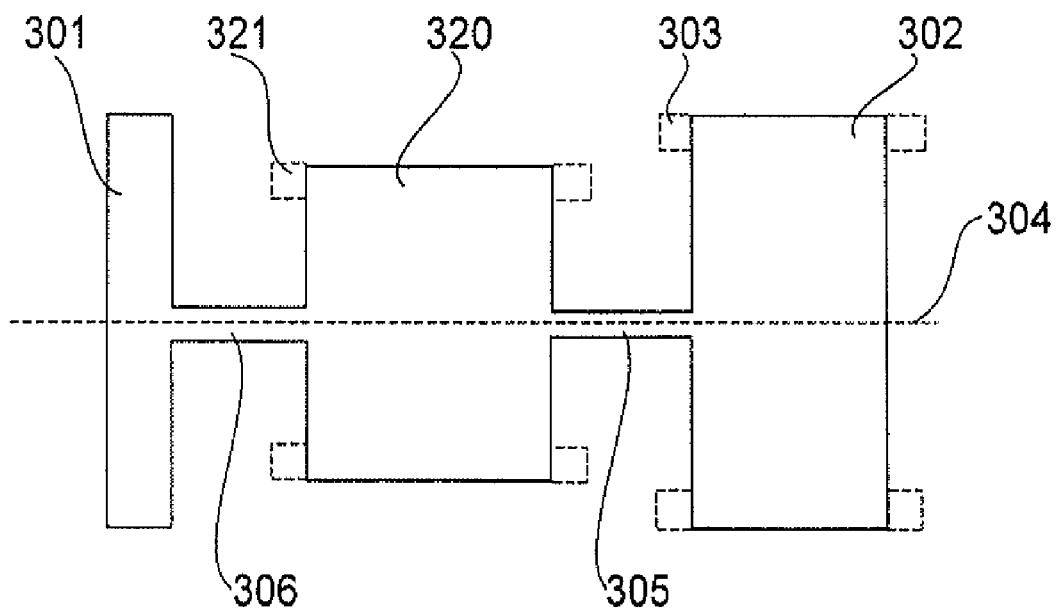
FIG. 10A is a plan view of an oscillating system according to a third working example of the present invention.

An oscillator device according to a third working example of the present invention will be described below. FIG. 10A is a plan view of an oscillator device according to the third working example, having two oscillating members provided for oscillating motion about an oscillation axis 304. In this working example, these two oscillating members comprise first and second movable elements 302 and 320 having protrusions 303 and 321, respectively, for adjustment of the mass of the oscillating members. The first movable element 302 is resiliently supported by a first resilient support (torsion spring) 305, for torsional oscillation about the oscillation axis 304 relative to the second movable element 320. The second movable element 320 is resiliently supported by a second resilient support (torsion spring) 306, for torsional oscillation about the oscillation axis 304 relative to a supporting member 301.

In this working example, the mass adjusting member is not separately provided. Rather, a portion of the movable elements 302 and 320 themselves is formed as protrusions 303 and 321 extending in a direction parallel to the oscillation axis 304, to take the role of the mass adjusting member. By cutting out a desired portion of each protrusion by use of a laser beam, an appropriate volume can be removed therefrom.

The oscillator device of this working example is driven by a driving means, not shown, in accordance with a combined driving signal based on a reference frequency $f_0$ (target driving frequency as determined by the specifications of the system application) and a frequency $2f_0$ which is twice the reference frequency. The oscillator device has two natural mode frequencies $f_1$ and $f_2$ about the oscillation axis 304, and these frequencies are tuned to approximately match the frequencies $f_0$ and $2f_0$, respectively, in accordance with the method to be described below in detail. Hence, in this working example, a combined-wave drive based on two signals having frequencies $f_0$ and $2f_0$ is accomplished while utilizing a high amplitude amplification factor of the natural oscillation mode.

The combined-wave driving method will be explained below in more detail.

Figure 11:
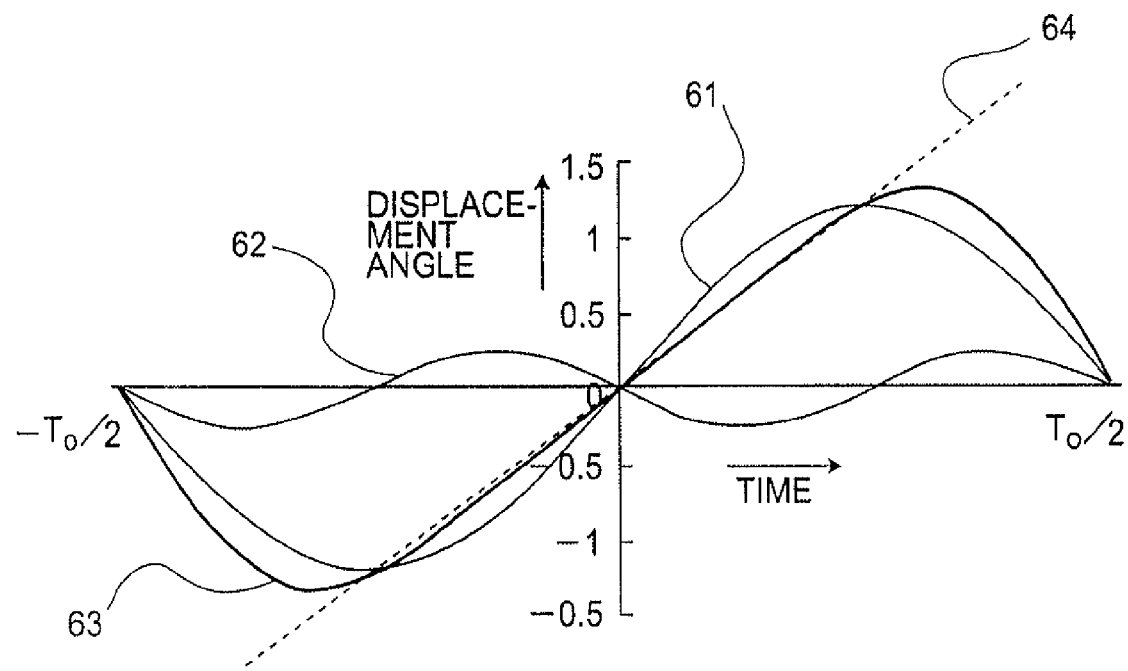
FIG. 11 is a graph for explaining a displacement angle of a first movable element in an oscillator device according to the third working example of the present invention.

FIG. 11 is a graph with time t taken on the axis of abscissa, and it explains the displacement angle of the first movable element 302 during torsional oscillation of a frequency $f_0$. Specifically, this drawing illustrates the portion corresponding to one cycle $T_0$ of the torsional oscillation of the first movable element 302, wherein $-T_0/2 < X < T_0/2$.

Curve 61 depicts the sinusoidal-wave component of the reference frequency $f_0$ of the torsional oscillation of the first movable element 302. It is a sinusoidal oscillation which reciprocally oscillates within the range of largest amplitude $\pm\phi_1$ and is expressed by Equation (2) below, where time is t and angular frequency is $w_0 = 2\pi f_0$.

$$\theta_1 = \phi_1 \sin[w_0 t] \quad (2)$$

On the other hand, curve 62 depicts the sinusoidal-wave component of the frequency twice the reference frequency $f_0$, and it is sinusoidal oscillation which oscillates in the range of largest amplitude $\pm\phi_2$ and is expressed by Equation (3) below.

$$\theta_2 = \phi_2 \sin[2w_0 t] \quad (3)$$

Curve 63 depicts the displacement angle of the torsional oscillation of the first movable element 302 produced as a result of the driving described above. With regard to the torsional oscillation about the oscillation axis 304, the oscillator device has a natural oscillation mode of frequency $f_1$ and a second-order natural oscillation mode of frequency $f_2$, being tuned respectively around the reference frequency $f_0$ and the frequency $2f_0$ twice the reference frequency, as described hereinbefore. Hence, both resonance excited by the driving signal corresponding to $\theta_1$ and resonance excited by the driving signal corresponding to $\theta_2$ occur in the oscillator device. Namely, the displacement angle of the first movable element 302 in curve 63 is based on the oscillation provided by superposition of these two sinusoidal oscillations; that is, a sawtooth-wave-like oscillation that can be expressed by Equation (4) below is produced.

$$\theta = \theta_1 + \theta_2 = \phi_1 \sin[w_0 t] + \phi_2 \sin[2w_0 t] \quad (4)$$

Figure 12:
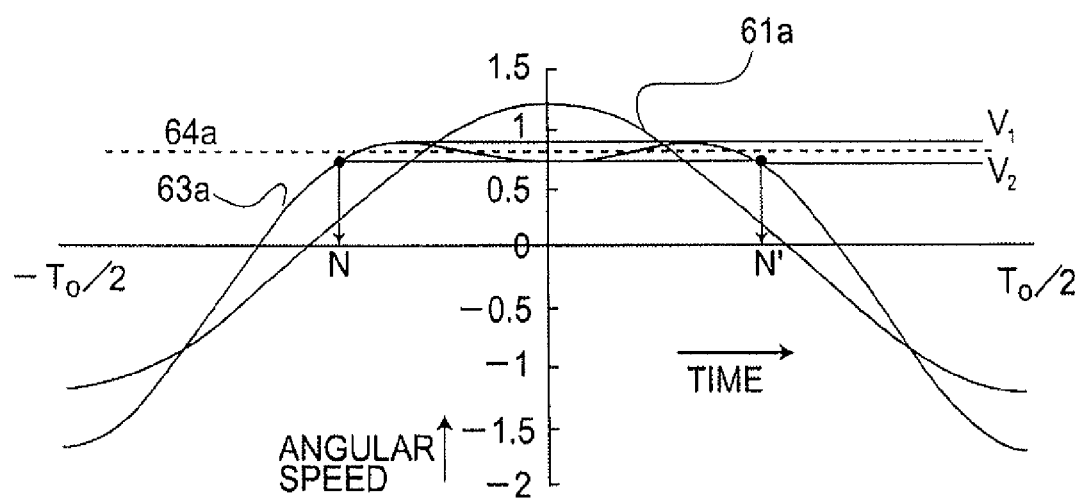
FIG. 12 is a graph for explaining an angular speed of a first movable element in an oscillator device according to the third working example of the present invention.

FIG. 12 shows curves 61a and 63a and a straight line 64a, obtained by differentiating the curves 61 and 63 and a straight line 64 of FIG. 11, and it illustrates the angular speed of these curves. As compared with the curve 61a which depicts the angular speed of sinusoidal oscillation of the reference frequency $f_0$, the curve 63a that depicts the angular speed of sawtooth-wave-like reciprocal oscillation of the first movable element 302 has a feature that in the section N-N' the angular speed is kept within the range having upper and lower limits corresponding to the angular speed $V_1$ at the maximum and the angular speed $V_2$ at the minimum, respectively. Therefore, in an application of the oscillator device wherein a reflection surface 22 is formed on the first movable element 302 to provide deflective scan of light, if $V_1$ and $V_2$ are present within the allowable error range of the angular speed from the straight line 64a which corresponds to constant angular-speed scan, the section N-N' can be regarded as a substantially constant angular-speed scan region.

As described above, as compared with the oscillation based on the displacement angle following sinusoidal waves, the sawtooth-wave reciprocal oscillation does provide, for the angular speed of deflective scan, a much wider region in which the angular speed is substantially constant. Thus, the ratio of the available region to the whole deflective scan region is notably enlarged. Furthermore, since the modulation timing of the light source for light spot formation can be set without caring about the non-uniformness of angular speed, the modulation circuit is simplified.

Additionally, since the change of the angular speed during oscillation is small, deformation of the reflection surface when it is driven is very small.

Furthermore, the scan lines having regular intervals are assured, and this is quite advantageous in the application to printers, for example.

Although the foregoing description has been made with reference to an example wherein the frequencies $f_1$ and $f_2$ of natural oscillation modes have a "double" relationship that the latter is approximately twice the former, a "triple" relationship wherein the latter is approximately three times the former may be set. In that occasion, like the "double" relationship, through the oscillation based on superposition of sinusoidal waves, chopping-wave-like oscillation is provided. Since this enables utilization of reciprocal scan of light, the number of scan lines at a certain available frequency can be doubled.

By the way, in such oscillator devices as being driven while simultaneously exciting two or more natural oscillation modes in the torsional oscillation direction, the smaller the mode damping ratio of each mode is, the lower the power consumption is. On the other hand, if the mode damping ratio is small, the setting range for the target frequencies of the plural natural oscillation modes (e.g., frequencies $f_1$ and $f_2$ in the optical deflector of this working example) is narrow. Therefore, when the power consumption of the optical deflector is lowered, the frequencies of the natural oscillation modes should be adjusted very precisely.

Figure 13:
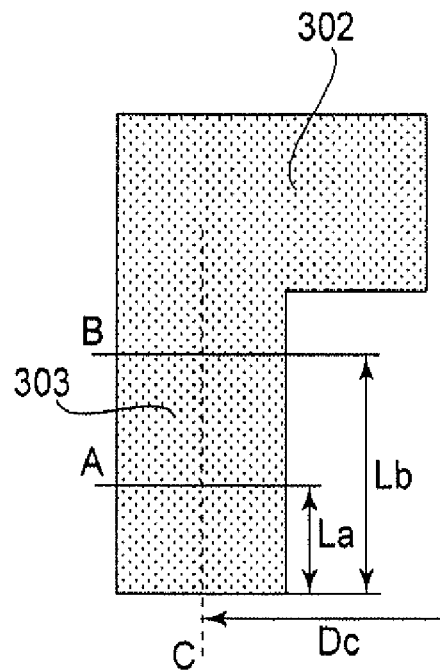
FIG. 13 is a fragmentary plan view, showing a first movable element and a protrusion, in the third working example of the present invention.

Referring to FIG. 13, a method of tuning the natural mode frequencies $f_1$ and $f_2$ to frequencies $f_0$ and $2f_0$ will be explained. FIG. 13 is a fragmentary enlarged view of the first movable element 302 and one protrusion 303 of the oscillator device shown in FIG. 10A. A central axis C extending through the protrusion 303 passes through the center of the thickness of the protrusion 303 (i.e., the length thereof in the direction of a normal to the sheet of the drawing), and it is parallel to the oscillation axis 304. The protrusion 303 has a uniform sectional shape or sectional area (along a section with respect to which the central axis C functions as a normal), irrespective of the position. Namely, at a position A and at a position B, for example, it has the same sectional shape.

With regard to the removal of protrusion 303, the volume to be removed is determined in accordance with the difference (remainder) of the frequency $f_1$ (or frequency $f_2$) from the reference frequency $f_0$ (or $2f_0$). For the removal, the protrusion 303 is cut along a cutting section with respect to which the central axis C functions as a normal (namely, along a section perpendicular to the central line C). Here, by adjusting the cutting position, the removing amount is adjusted. For example, the protrusion 303 is cut at the position A or position B, in accordance with the frequency difference (remainder) described above. The moment of inertia of the removed length La or Lb is equal to the product of the removed mass and the square of the distance Dc between the central axis C and the oscillation axis 304. The ratio of the inertia-moment adjusting amounts at the positions A and B is equal to the ratio of the lengths La and Lb. Thus, the removal amount is in proportion to the length and, therefore, the removing amount can be concluded quickly.

Furthermore, since the portion ranging from the cutting position to the tip end of the protrusion is removed by the cutting operation and this portion is much wider than the laser beam machining region, the removing process can be completed very fast. This is advantageous not only in that it shortens the process time but also in that heat transfer to the oscillator device during the laser beam machining is reduced. Thus, unwanted thermal damage or change in property of the oscillator device is well avoided. Furthermore, debris or dust particles from the protrusion to be produced by the laser beam machining are reduced and, therefore, contamination of the oscillator device is well avoided. Moreover, since the laser beam machining length for achieving a desired removing amount is uniform irrespective of the position A or position B, both the process time and the process moving amount (machining laser scan length or machining stage moving amount) are constant. This makes the oscillator device adjustment quite simple and inexpensive.

Both of the protrusions 303 and 321 of the first and second movable elements 302 and 320 are made parallel to the oscillation axis 304. Therefore, the cutting sections to the protrusions 302 and 320 are parallel to each other. Hence, the laser beam machining can be done in the same direction, and the structure of the laser beam machining device can be simple.

In the manner described above, even if there remains a machining error in the first and second resilient supports 305 and 306 or the like and the two natural mode frequencies $f_1$ and $f_2$ have a large difference with respect to the frequencies $f_0$ and $2f_0$, these frequencies can be tuned accurately.

Fourth Working Example

Figure 10B:
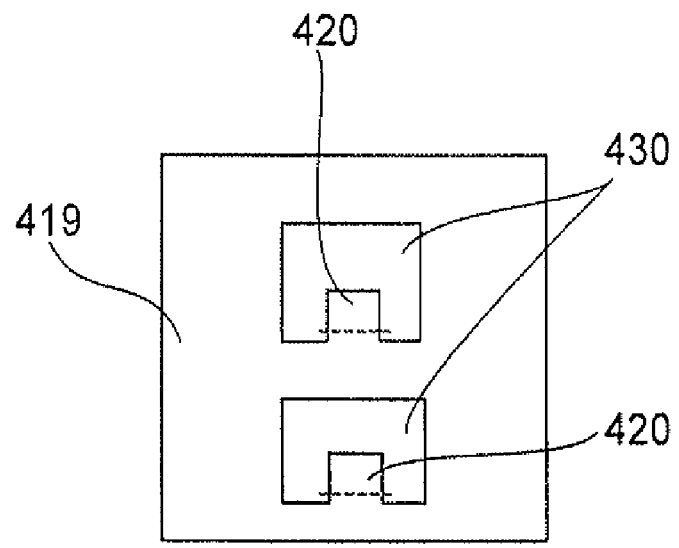
FIG. 10B is a plan view of a mass adjusting member according to a fourth working example of the present invention.

An oscillator device according to a fourth working example of the present invention will now be described. FIG. 10B is a schematic plan view of a mass adjusting member 419 provided on a movable element which is arranged to oscillate about an oscillation axis. The mass adjusting member 419 of this working example has a plurality of protrusions 420 extending from the mass adjusting member 419 to hang over a cavity 430. In this example, for tuning the frequency of natural oscillation mode about the oscillation axis to a target frequency or adjusting the gravity center position of the oscillating member into alignment with the oscillation axis, the base portion of the protrusion 430 is cut off by a laser beam, as depicted by a broken line in FIG. 10B. More specifically, an appropriate number of protrusions 430 are cut off with an appropriate removal volume. Once the position of each protrusion (distance from the oscillation axis) and the mass of the same are set, the amount of adjustment of the inertia moment or gravity center position to be obtained by cutting the protrusion can be predetermined. Therefore, the inertia moment or gravity center position can be controlled very precisely.

Fifth Working Example

Figure 14:
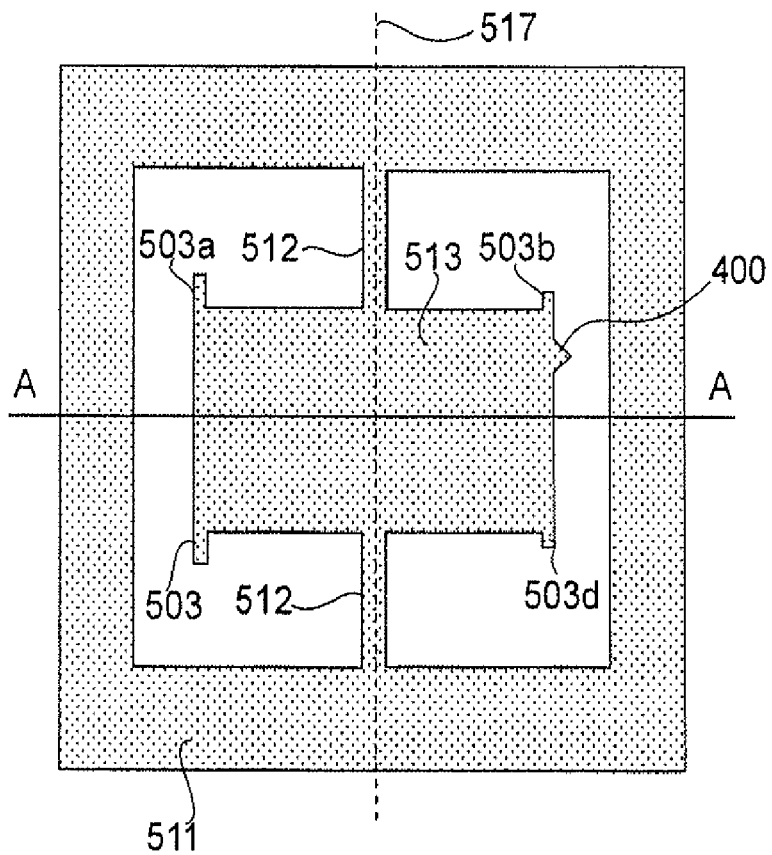
FIG. 14 is a plan view of an oscillator device according to a fifth working example of the present invention.
Figure 15:
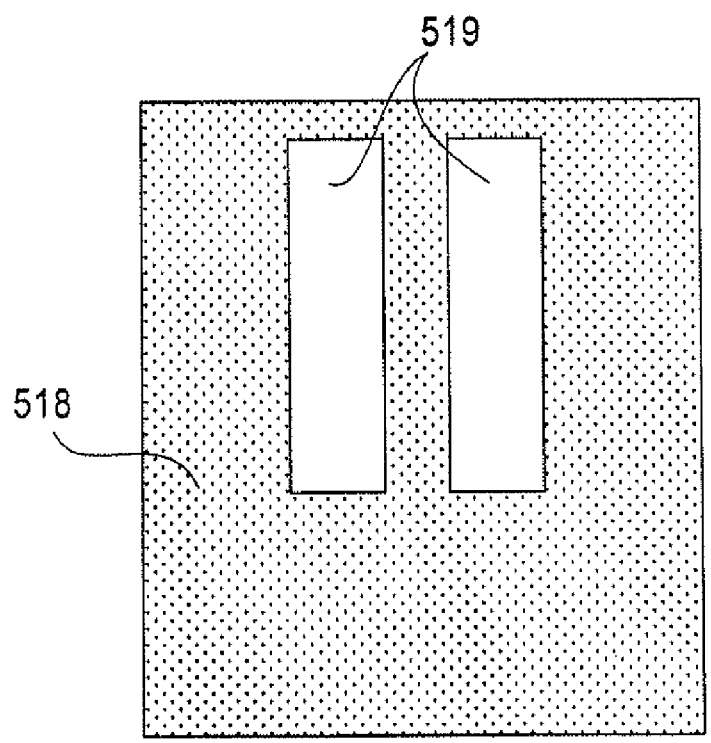
FIG. 15 is a plan view of a driving substrate of the oscillator device according to the fifth working example of the present invention.
Figure 16:
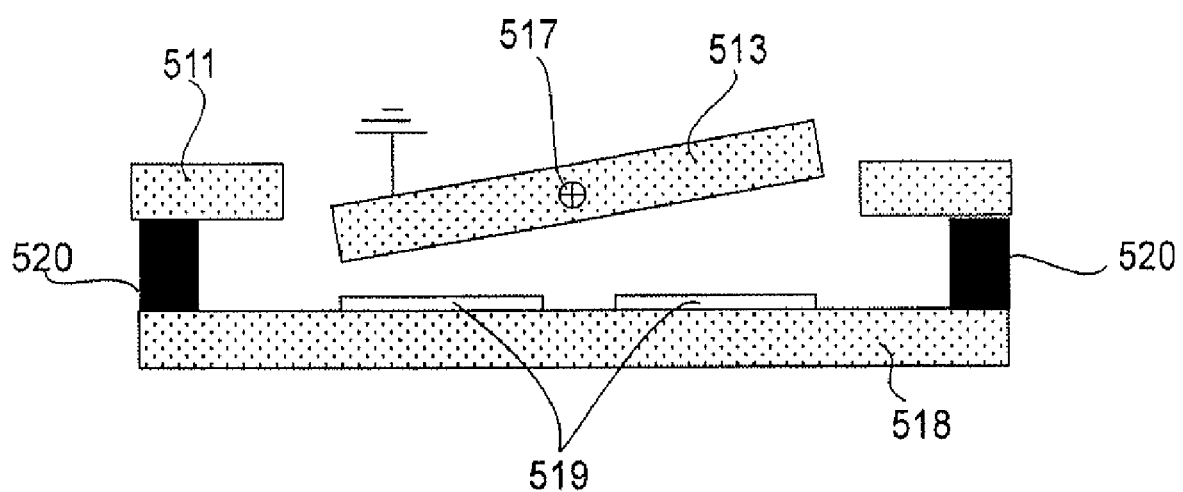
FIG. 16 is a sectional view of the oscillator device according to the fifth working example of the present invention.

FIGS. 14, 15 and 16 show an optical deflector according to a fifth working example of an oscillator device of the present invention. FIG. 14 is a plan view of an oscillating system of the optical deflector, and FIG. 15 is a plan view of a driving substrate having a driving means for driving the oscillating system. FIG. 16 is a sectional view taken along a line A-A in FIG. 14, and it illustrates the structure in which the oscillating system and the driving substrate are assembled. In this working example, a movable element 513 is formed with protrusions 503a, 503b, 503c and 503d as illustrated, and this provides an oscillating member. The oscillating system comprises this oscillating member, a pair of resilient supports 512 and a supporting member 511. The movable element 513 has a size 1.5 mm in a direction perpendicular to an oscillation axis 517 and a size 1 mm in a direction parallel to it, for example.

In this working example, the movable element 513 is resiliently supported by the paired resilient supports 512, for torsional oscillation about the oscillation axis 517. The protrusions 503a and 503b and the protrusions 503c and 503d are joining with the movable element 513 at symmetrical positions sandwiching the oscillation axis, as illustrated. All of these protrusions extend in a direction parallel to the oscillation axis 517. Comparing the paired protrusions 503a and 503b (or 503c and 503d) with each other, it is seen that they have different lengths. Namely, the protrusions joining with the movable element at symmetrical positions have asymmetrical shapes with respect to the oscillation axis 517.

FIG. 15 shows a driving substrate 518 and a pair of driving electrodes 519. As illustrated, the driving electrodes 519 are formed symmetrically with respect to the oscillation axis 517. Furthermore, as shown in FIG. 16, the driving substrate 518 and the oscillating system are assembled with spacers 520 interposed therebetween to keep a suitable interspace between them. Hence, the movable element 513 is disposed opposed to the driving electrodes 519 with a cavity intervening therebetween. The movable element 513 is electrically grounded. Thus, by alternately applying a high voltage to the driving electrodes 519 disposed symmetrically, an electrostatic attracting force is produced between the movable element 513 and the voltage-applied driving electrodes 519. This causes a torque about the oscillation axis 517 and it drives the oscillating system.

The driving principle of the optical deflector in this working example is the same as the first working example. However, due to various error factors such as dispersion of physical property of the material or process tolerance, for example, the frequency $f_1$ may shift from the reference frequency $f_0$. In the structure shown in FIG. 14, there is a process error fault 400 caused by an error in the mask shape during a dry etching process. Due to unintentional factors in semiconductor manufacturing processes, such process error fault may be caused and the yield of the product will be slowed down by it. The process error fault 400 may be a fault of shape as like a protrusion illustrated here or a recess, or it may be adhered debris or the like.

Such process error fault as shown at 400 will become an error factor for the moment of inertia of the whole oscillating member. In theses situations, as seen from Equation (1), an error will occur also in the frequency $f_1$ of the natural oscillation mode of the oscillating system, and a good amplitude amplification factor will be unattainable any more. Furthermore, the process error fault 400 will cause offset of the gravity center position of the whole oscillating member, from the designed position in an unintended direction. If such offset distance occurs, it causes unwanted oscillation which is quite undesirable with respect to the oscillation of the oscillating system. Since this may cause a tilt error of the reflection surface of the movable element 513, the scanning characteristic would be degraded thereby.

In an idealistic state without such gravity center shift, the movable element 513 torsionally oscillates about the oscillation axis 517 in response to a driving signal of a frequency $f_0$. On the other hand, if a gravity center shift from the oscillation axis 517 is there, in response to the torsional oscillation, an inertia force is produced in the movable element in a direction from the oscillation axis 517 to the gravity center position. This inertia force in turn causes unwanted oscillation of a characteristic frequency in a direction of the gravity center offset. As a result, the scanning characteristic is deteriorated.

Degradation of the scanning characteristic described above can be avoided by adjusting both the natural oscillation mode frequency $f_1$ and the gravity center offset distance, and hence a low power-consumption optical deflector is accomplished.

Referring again to FIG. 13 having been described with reference to the third working example, a method of simultaneously adjusting both the natural oscillation mode frequency $f_1$ and the gravity center offset distance will be explained. Here, the reference numeral 302 in FIG. 13 should read "513" for the movable element 513 of FIG. 14, and the reference numeral 303 should read "503c" for the protrusion 503c of FIG. 14.

A central axis C extending through the protrusion 503c passes through the center of the thickness of the protrusion 503c (i.e., the length thereof in the direction of a normal to the sheet of the drawing), and it is parallel to the oscillation axis 517. The protrusion 503c has a uniform sectional shape (along a section with respect to which the central axis C functions as a normal) irrespective of the position. Namely, at a position A and at a position B, for example, it has the same sectional shape.

With regard to the removal of protrusion 503c, the volume to be removed is determined in accordance with the difference (remainder) of the frequency $f_1$ from the reference frequency $f_0$ and the offset distance of the gravity center position. For the removal, the protrusion 503c is cut along a cutting section with respect to which the central axis C functions as a normal (namely, along a section perpendicular to the central line C). Here, by adjusting the cutting position, the removing amount is adjusted.

For example, the protrusion 503c is cut at the position A or position B, by means of laser beam irradiation. The moment of inertia of the removed length La or Lb is equal to the product of the removed mass and the square of the distance Dc between the central axis C and the oscillation axis 517. Since the removal amount is in proportion to the length, the ratio of the inertia-moment adjusting amounts at the positions A and B to be provided by the mass removal is equal to the ratio of the lengths La and Lb.

On the other hand, as shown in FIG. 14, the protrusions are formed at positions which are symmetrical with each other with respect to the oscillation axis 517. FIG. 14 illustrates the structure after the protrusions are partly removed in accordance with the method described above. Before this mass removal, the paired protrusions 503a and 503b and the paired protrusions 503c and 503d can be formed with the same width and same length. Hence, with regard to the paired protrusions 503a and 503b and the paired protrusions 503c and 503d, the removed length is different. By adjusting this ratio, the offset distance of the gravity center of the oscillating member can be adjusted.

In this working example, the frequency of the natural oscillation mode of the oscillating system is measured first, and the adjusting amount of the inertia moment for tuning the same to its design value is concluded. The frequency measurement can be done based on the information about a scanning beam as detected by using a light receiving element, the information detected by a piezoelectric resistance which may be provided at the resilient support, and so on. Based on the concluded amount, the sum of the lengths of the protrusions 503a-503d to be removed can be determined. In the method of producing an oscillator device of this working example having at least one natural oscillation mode about an oscillation axis, this process includes the following steps. Namely, it includes a step of measuring the frequency of natural oscillation mode about the oscillation axis of the oscillator device, and a step of determining the sum of removing amounts of plural protrusions on the basis of the measured frequency.

Subsequently, in accordance with the offset distance of the gravity center position, the ratio of removing lengths of the paired protrusions 503a and 503b or paired protrusions 503c and 503d is determined. The gravity center offset distance can be determined by measuring the scan locus of the scanning light beam and calculating the difference (remainder) from an idealistic scan locus. In the method of producing an oscillator device of this working example having at least one natural oscillation mode about an oscillation axis, this process includes the following steps. Namely, it includes a step of driving the oscillator device, a step of detecting the state of oscillation or driving waveform of the oscillating member of the oscillator device, and a step of comparing the detected state of oscillation with a target oscillation state and determining, based on the comparison, the ratio of removing amounts of the protrusions so as to reduce the offset distance.

The removing-amount sum determining step and the removing-amount ratio determining step mentioned above can be summarized as the procedure including the following steps: namely, a step of driving the oscillator device; a step of detecting the state of oscillation of the oscillating member of the oscillator device; and a step of comparing the detected state of oscillation with a target oscillation state and determining, based on the comparison, the shape to be removed from the protrusion.

In accordance with the lengths of the removal determined as described above, the laser beam irradiation position is changed and the protrusions 503a-503d are processed to have asymmetrical lengths with respect to the oscillation axis 517. By this procedure, in this working example, the adjustment of the natural oscillation mode frequency and the adjustment of the gravity center offset distance can be done simultaneously.

Particularly, in this working example, the adjusting amount of the inertia moment is in proportion to the process length, the process target value can be determined at once.

Sixth Working Example

Figure 17:
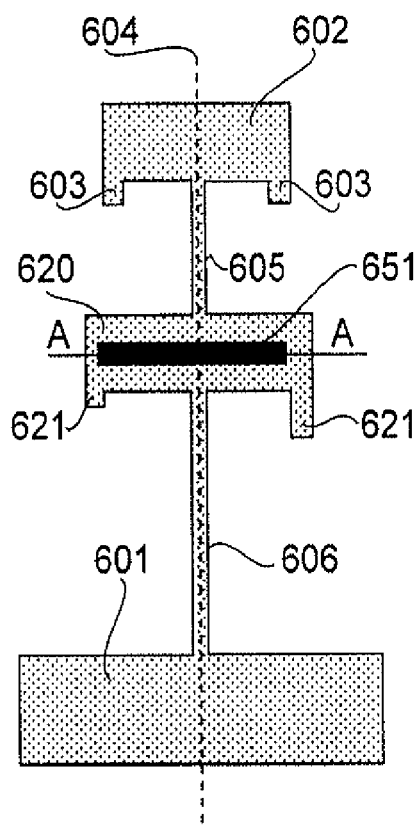
FIG. 17 is a plan view of an oscillator device according to a sixth working example of the present invention.

An oscillator device and a method of producing the same, according to a sixth working example of the present invention will be described below. FIG. 17 is a plan view of this example of oscillator device which includes two oscillating members provided to oscillate about an oscillation axis 604. In this working example, the two oscillating members comprise first and second movable elements 602 and 620 having first and second protrusions 603 and 621, respectively, for adjusting the mass of the oscillating members, respectively. The first movable element 602 is resiliently supported by a first resilient support (torsion spring) 605, for torsional oscillation about the oscillation axis 604 relative to the second movable element 620. The second movable element 620 is resiliently supported by a second resilient support (torsion spring) 606, for torsional oscillation about the oscillation axis 604 relative to a supporting member 601. There are permanent magnets 651 fixed to the second movable element 620. These permanent magnets 651 are adhered to the opposite surfaces of the second movable element 620, one surface being shown in FIG. 17.

In this working example, a portion of the first and second movable elements 602 and 620 themselves is formed into protrusions 603 and 621 extending in a direction parallel to the oscillation axis 604. Like the fifth working example, these protrusions 603 and 621 are initially formed at symmetrical positions with symmetrical shapes with respect to the oscillation axis 604. Then, like the fifth working example, a desired portion of the protrusions is cut off by means of a laser beam, by which asymmetrical lengths of appropriate volumes are removed from these protrusions.

The first movable element 602 and the first protrusions 603 constitute a first oscillating member, and the second movable element 620, second protrusions 621 and permanent magnets 651 constitute a second oscillating member. These oscillating members can oscillate integrally about the oscillation axis 604.

Figure 18:
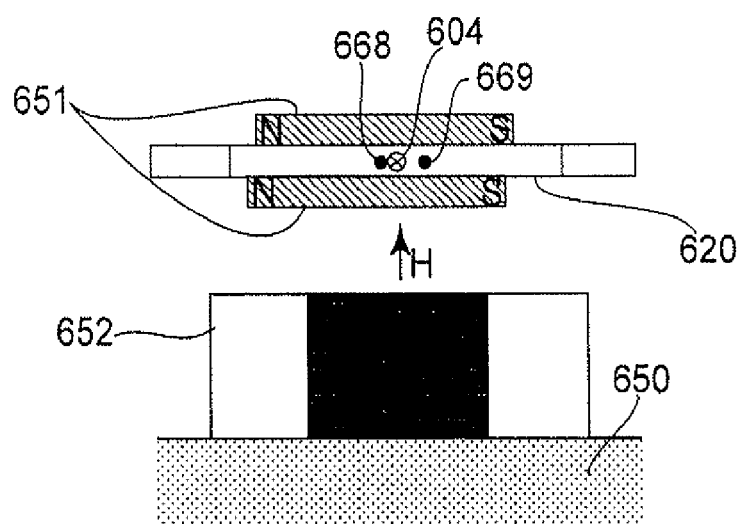
FIG. 18 is a sectional view of the oscillator device according to the sixth working example of the present invention.

The oscillator device of this working example is driven by a driving means, including the permanent magnets 651 and a fixed coil 652, in accordance with a combined driving signal based on a reference frequency $f_0$ (target driving frequency as determined by the specifications of the system application) and a frequency $2f_0$ which is twice the reference frequency. FIG. 18 is a sectional view taken along a line A-A in FIG. 17. As shown in FIG. 18, the fixed coil produces a magnetic field in the direction of an arrow H. This magnetic field acts on the permanent magnets 651 mounted on the second movable element, to produce a torque about the oscillation axis 304, by which the oscillating system is driven.

The oscillator device has two natural mode frequencies $f_1$ and $f_2$ about the oscillation axis 604, and these frequencies are tuned to approximately match the frequencies $f_0$ and $2f_0$. Hence, in this working example, a combined-wave drive based on two signals having frequencies $f_0$ and $2f_0$ is accomplished while utilizing a high amplitude amplification factor of the natural oscillation mode. The combined-wave driving method is the same as the third working example, having been described in conjunction with FIGS. 11 and 12.

In this working example, the frequencies $f_1$ and $f_2$ of two natural oscillation modes of the oscillation system about the oscillation axis 604 have a relationship of "multiple by an integer". Therefore, the inertia moments of the first and second oscillating members should satisfy the relation of Equation (5) below.

$$I_2/I_1 \geq 4n^2/(n^4-2n^2+1) \qquad (5)$$

where $I_1$ and $I_2$ are inertia moments of the first and second oscillating members, respectively, and n is an integer that represents $f_2/f_1$.

The oscillating system of this working example has a double relation between the frequencies $f_1$ and $f_2$, and hence the relation of Equation (6) below is satisfied.

$$I_2/I_1 \geq 1.78. \qquad (6)$$

Namely, in this working example, the second oscillating member has a larger inertia moment than the first oscillating member. Such magnitude relation of inertia moment is effectively provided by placing the permanent magnets 651 (driving means) only at the second movable element 620. Hence, by means of the permanent magnets 651, an oscillating member structure suited to realizing two natural oscillation modes having a double-frequency relation, is accomplished.

Here, a case wherein, as shown in FIGS. 17 and 18, the permanent magnets 651 are adhered or disposed with a shift in the leftward direction as viewed in the drawings, will be considered. The gravity center 668 of the permanent magnets 651 is offset leftwardly from the oscillation axis 604. On the other hand, with regard to the protrusions 621, as seen from FIG. 17, the removing amount of one of the protrusions 621 which is at the side to which the permanent magnets 651 has shifted is made larger. The ratio of removed lengths of asymmetrical protrusions 621, being asymmetrical with respect to the oscillation axis 604, can be determined in accordance with the method based on measuring the scan locus, having been described with reference to the fifth embodiment, for example.

A spot 669 depicts the gravity center of the second movable element with protrusions 621 being partly removed by such asymmetrical lengths as described. The line segment connecting the gravity center 668 with the gravity center 669 passes through the oscillation axis 604. The ratio of offset distances of the gravity centers of the permanent magnets 651 and the second movable element 620, from the oscillation axis 604, is approximately equal to the ratio of inverses of the masses of the permanent magnets 651 and the second movable element 620. Because of these relationships, the gravity center of the whole second oscillating member is placed on the oscillation axis 604.

With regard to factors that may cause offset of the gravity center from the oscillation axis 604, there may be different factors such as process tolerance as has been described with reference to the fifth working example. Anyway, such offset distance of the gravity center of the oscillating member can be adjusted in accordance with the method of this working example described above.

Unwanted oscillation resulting from the gravity center offset of the oscillating member described above may cause coupling between plural natural oscillation modes where the oscillating system comprises a multiple degree-of-freedom oscillating system, and the scan reproducibility would be degraded largely thereby. Particularly, since in this working example the frequencies of the two natural oscillation modes have a "double relation", the frequency of the unwanted oscillation mentioned above will be twice the reference frequency, i.e., equal to the other frequency. Therefore, two natural oscillation modes will be coupled strongly. This would result in that, in addition to the bend of the scan locus, the scan reproducibility is degraded seriously.

In this working example, the protrusions 603 and 621 are removed asymmetrically and, by doing so, the two frequencies $f_1$ and $f_2$ of the oscillating system having two natural oscillation modes as well as the gravity center offset distances of the two oscillating members can be adjusted simultaneously. This enables combined-wave driving with lower power consumption and superior scan reproducibility as well. In this manner, the inertia moment and the gravity center position of the oscillating member can be adjusted simultaneously and quickly.

Seventh Working Example

Figure 19:
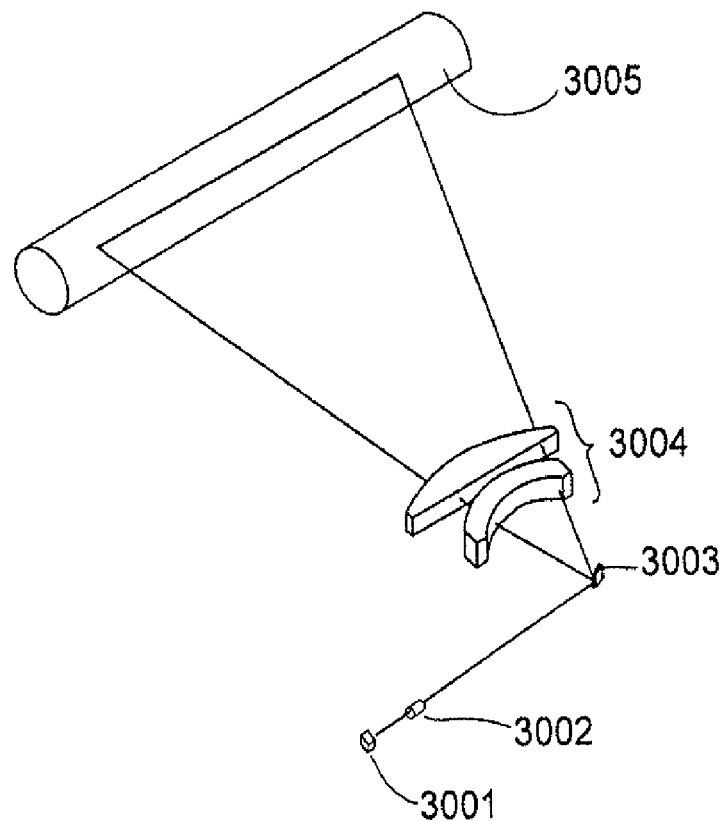
FIG. 19 is a perspective view of an optical instrument with an optical deflector, according to a working example of the present invention.
Figure 20:
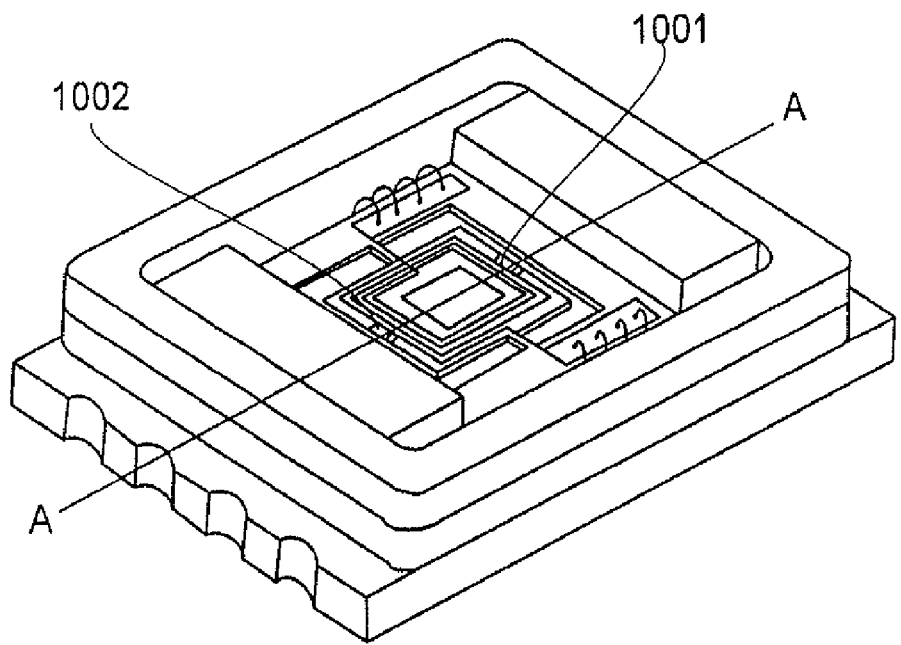
FIG. 20 is a perspective view of an optical deflector of known type.

FIG. 19 is a schematic and perspective view, showing a working example of an optical instrument into which an optical deflector according to the present invention is incorporated. In this example, an image forming apparatus is shown as the optical instrument. In FIG. 19, denoted at 3003 is an optical deflector according to the present invention, and it functions to one-dimensionally scan the light incident thereon. Denoted at 3001 is a laser light source, and denoted at 3002 is a lens or lens group. Denoted at 3004 is a writing lens or lens group, and denoted at 3005 is a drum-shaped photosensitive member.

A laser beam emitted from the laser light source 3001 has been modulated by predetermined intensity modulation related to the timing of deflective scan of light. The intensity-modulated light goes through the lens or lens group 3002, and it is one-dimensionally scanningly deflected by means of an optical scanning system (optical deflector) 3003. The scanningly deflected laser beam is focused by the wring lens or lens group 3004 on the photosensitive member 3005 to form an image thereon.

The photosensitive member 3005 rotates about a rotational axis in a direction perpendicular to the scan direction, and it is uniformly charged by means of a charger, not shown. By scanning the photosensitive member surface with light, an electrostatic latent image is formed in the scanned surface portion. Subsequently, by using a developing device, not shown, a toner image is produced in accordance with the electrostatic latent image, and the toner image is then transferred to and fixed on a transfer sheet, not shown, whereby an image is produced on the sheet.

In accordance with this working example, use of an optical deflector well tuned to a desired frequency is enabled. Hence, it can be driven with a high amplitude amplification factor and, therefore, the device can be made compact and the power consumption can be slowed down. Furthermore, the angular speed of deflective scan of light can be made approximately even within the effective region of the photosensitive member 3005 surface. Additionally, with the use of the optical deflector of the present invention, scan position variation is reduced, and an image forming apparatus capable of producing a sharp image is accomplished.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2006-158004 filed Jun. 7, 2006, Japanese Patent Application No. 2007-065950 filed Mar. 15, 2007, and Japanese Patent Application No. 2007-130619 filed May 16, 2007, for which is hereby incorporated by reference.

What is claimed is:

1. A method of producing an oscillator device having an oscillating member, a resilient support and a supporting member, the oscillating member being resiliently supported by the resilient support for oscillation about an oscillation axis, said method comprising:

forming the oscillating member with a movable element having a plurality of protrusions for adjusting a mass of the oscillating member, the protrusions extending from the movable element in a direction parallel to the oscillation axis and being formed in pairs, each pair being disposed at positions symmetrical with respect to the oscillation axis, wherein a sectional area of each protrusion along a plane perpendicular to the oscillation axis is constant in the oscillation axis direction; and projecting a laser beam to a cutting position of each of protrusions be cut, so as to partly remove the protrusion, wherein the protrusions are so cut that based on adjusting the cutting position, the sum of the lengths removed from the protrusions by the cutting becomes equal to a predetermined length to thereby adjust an inertia moment of the oscillating member.

2. The method according to claim 1, wherein the sum of the lengths removed from the protrusions by the cutting is determined on the basis of a difference between a frequency of a natural oscillation mode of the oscillator device and a target frequency.

3. The method according to claim 2, wherein the amounts removed, by the cutting, from those protrusions disposed at symmetrical positions with respect to the oscillation axis are in a ratio which is so determined as to reduce an offset distance, from the oscillation axis, of a gravity center of the oscillating member.

4. The method according to claim 3, wherein the protrusions are formed only at positions on that oscillating member, most remote from the oscillation axis.

5. The method according to claim 4, wherein the oscillator device has a coil and a permanent magnet for driving the oscillating member, and the permanent magnet is provided at the oscillating member.

6. A method of producing an oscillator device having a first oscillating member, a first resilient support a second oscillating member, a second resilient support, and a supporting member, the first oscillating member being resiliently supported by the second oscillating member through the first resilient support, for oscillation about an oscillation axis, the second oscillating member being resiliently supported by the supporting member through the second resilient support, for oscillation about the oscillation axis, and the oscillator device having at least two natural oscillation modes of different frequencies, said method comprising:

forming the first oscillating member with a first movable element having protrusions for adjusting a mass of the first oscillating member, the protrusions extending from the first movable element in a direction parallel to the oscillation axis and being formed in pairs, each pair being disposed at positions symmetrical with respect to the oscillation axis, wherein a sectional area of each protrusion along a plane perpendicular to the oscillation axis is constant in the oscillation axis direction;

forming the second oscillating member with a second movable element having protrusions for adjusting a mass of the second oscillating member, the protrusions extending from the second movable element in a direction parallel to the oscillation axis and being formed in pairs, each pair being disposed at positions symmetrical with respect to the oscillation axis, wherein a sectional area of each protrusion along a plane perpendicular to the oscillation axis is constant in the oscillation axis direction; and projecting a laser beam to a cutting position of each of protrusions to be removed, so as to partly remove the protrusion, wherein the protrusions are so cut that based on adjusting the cutting position, the sum of the lengths removed from the protrusions by the cutting becomes equal to a predetermined length to thereby adjust an inertia moment of at least one of the first movable element and the second movable element.

7. The method according to claim 6, wherein the sum of the lengths removed from the protrusions, by the cutting is determined on the basis of a difference between a frequency of a natural oscillation mode of the oscillator device and a target frequency.

8. The method according to claim 7, wherein the amounts removed, by the cutting, from those protrusions disposed at symmetrical positions with respect to the oscillation axis are in a ratio which is so determined as to reduce an offset distance, from the oscillation axis, of a gravity center of the first or second oscillating member.

9. The method according to claim 8, wherein the protrusions are formed only at positions on that oscillating member, most remote from the oscillation axis.

10. The method according to claim 9, wherein the oscillator device has a coil and a permanent magnet for driving the oscillating member, and the permanent magnet is provided at the second oscillating member.

11. The method according to claim 10, wherein the amounts removed, by the cutting, from those protrusions provided on the second oscillating member and disposed at symmetrical positions with respect to the oscillation axis are in a ratio which is so determined as to reduce an offset distance, from the oscillation axis, of a gravity center of the second oscillating member.

* * * * *